(12) United States Patent
Ogawa

(10) Patent No.: US 12,139,792 B2
(45) Date of Patent: Nov. 12, 2024

(54) SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventor: Arito Ogawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/671,206

(22) Filed: Feb. 14, 2022

(65) Prior Publication Data
US 2022/0259738 A1    Aug. 18, 2022

(30) Foreign Application Priority Data

Feb. 15, 2021  (JP) ................ 2021-021580

(51) Int. Cl.
*C23C 16/455*  (2006.01)
*C23C 16/52*  (2006.01)

(52) U.S. Cl.
CPC .. *C23C 16/45574* (2013.01); *C23C 16/45578* (2013.01); *C23C 16/52* (2013.01)

(58) Field of Classification Search
CPC ........ C23C 16/45546; C23C 16/45578; C23C 16/45574
See application file for complete search history.

(56) References Cited

U.S. PATENT DOCUMENTS

2011/0318940 A1   12/2011  Ota et al.
2012/0214300 A1*   8/2012  Kaga .................. H01L 21/0228
                                                                   438/597

(Continued)

FOREIGN PATENT DOCUMENTS

JP    2011-252221 A    12/2011
JP    2013-145796 A     7/2013

(Continued)

OTHER PUBLICATIONS

TIPO Office Action with English translation in Taiwan Application No. 111102096, dated Nov. 4, 2022, 13 pages.

(Continued)

*Primary Examiner* — Joseph A Miller, Jr.
(74) *Attorney, Agent, or Firm* — Edell, Shapiro & Finnan, LLC

(57) ABSTRACT

There is provided a technique capable of improving a processing uniformity between substrates. According to one aspect thereof, a substrate processing apparatus includes: a process vessel having a process region; a first nozzle having first holes, through which a first gas is supplied to substrates, arranged over the entire process region; a second nozzle having second holes, through which a second gas reacting with the first gas is supplied to the substrates, arranged over the entire process region; a third nozzle having third holes, through which an adsorption inhibitory gas inhibiting an adsorption of the first gas is supplied to the substrates, arranged corresponding to a part of the process region; and a gas supply system for supplying the first gas, the second gas and the adsorption inhibitory gas to the substrates through the first nozzle, the second nozzle and the third nozzle, respectively.

16 Claims, 12 Drawing Sheets

(56) References Cited

U.S. PATENT DOCUMENTS

| | | | |
|---|---|---|---|
| 2013/0052836 A1 | 2/2013 | Hirose et al. | |
| 2013/0095668 A1 | 4/2013 | Saito et al. | |
| 2015/0275368 A1 | 10/2015 | Motoyama et al. | |
| 2017/0253969 A1 | 9/2017 | Inaba et al. | |
| 2017/0278697 A1 | 9/2017 | Murakami et al. | |
| 2018/0211843 A1* | 7/2018 | Seino | H01L 21/32051 |
| 2019/0019673 A1 | 1/2019 | Ogawa et al. | |
| 2019/0316254 A1* | 10/2019 | Kang | C23C 16/4584 |
| 2020/0194269 A1 | 6/2020 | Ogawa et al. | |
| 2020/0407851 A1 | 12/2020 | Hiramatsu et al. | |

FOREIGN PATENT DOCUMENTS

| | | | |
|---|---|---|---|
| JP | 5692842 B2 | 4/2015 | |
| JP | 2016065287 A | 4/2016 | |
| JP | 2017-069407 A | 4/2017 | |
| JP | 2017-174918 A | 9/2017 | |
| JP | 2017157744 A | 9/2017 | |
| JP | 6436887 B2 | 12/2018 | |
| JP | 2019186531 A | 10/2019 | |
| TW | 1441259 B | 6/2014 | |
| TW | 1606513 B | 11/2017 | |
| WO | 2017168600 A1 | 10/2017 | |
| WO | 2019180905 A1 | 9/2019 | |
| WO | 2019188037 A1 | 10/2019 | |

OTHER PUBLICATIONS

Official Action in Singapore Application No. 10202201316Q, dated Jun. 7, 2023, 10 pages.

Notice of Reasons for Refusal with English translation in Japanese Application No. 2021-021580, issued Aug. 25, 2022, 14 pages.

IPOS Official Action in Singapore Application No. 10202201316Q, dated Apr. 10, 2024, 7 pages.

* cited by examiner

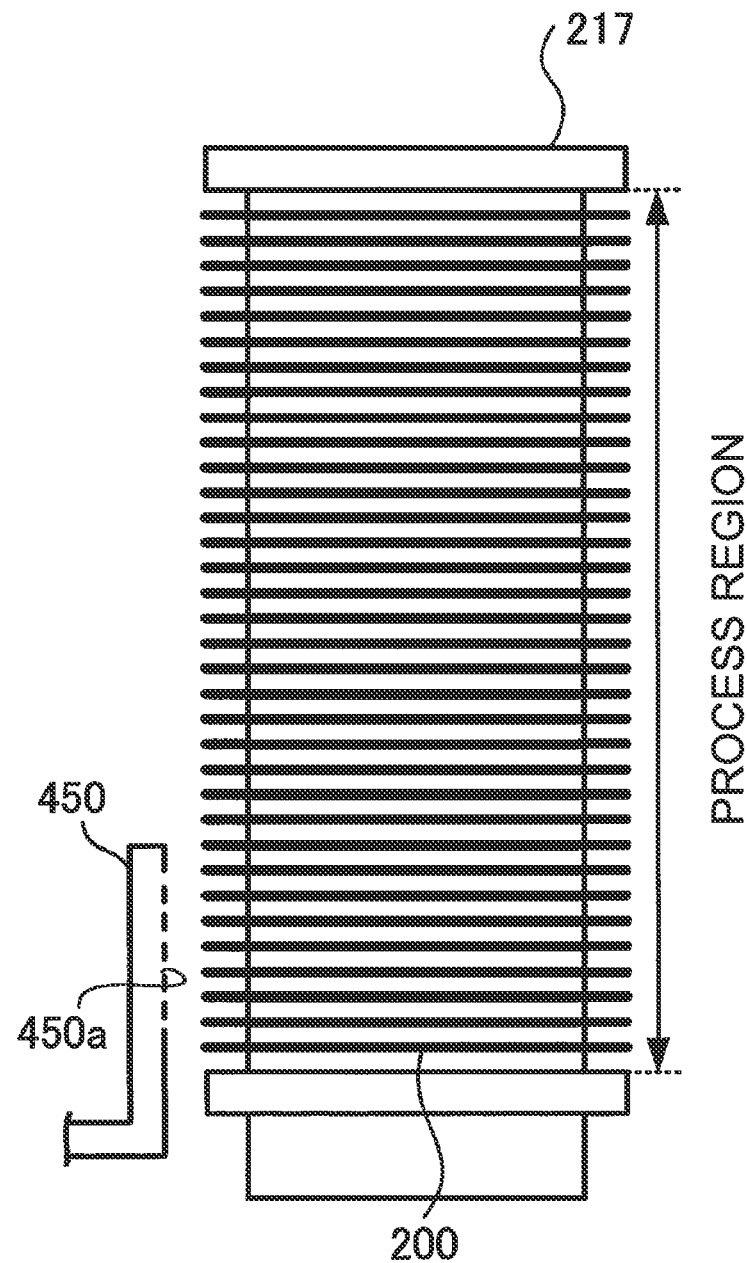

SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2021-021580 filed on Feb. 15, 2021, the entire contents of which are hereby incorporated by reference.

TECHNICAL FIELD

The present disclosure relates to a substrate processing apparatus, a substrate processing method, a method of manufacturing a semiconductor device and a non-transitory computer-readable recording medium.

BACKGROUND

For example, a metal film whose resistance is low is used as a word line of a DRAM or a NAND flash memory of a three-dimensional structure. For example, according to some related arts, a barrier film may be formed between the metal film and an insulating film.

However, when a film is formed on a substrate, an amount of reaction by-products generated may vary depending on an arrangement position of the substrate. As a result, a thickness of the film formed on the substrate may vary depending on the arrangement position of the substrate.

SUMMARY

According to the present disclosure, there is provided a technique capable of improving a processing uniformity between substrates.

According to one or more embodiments of the present disclosure, there is provided a technique related to a substrate processing apparatus including: a process vessel provided with a process region in which one or more substrates are processed; a first nozzle provided with a plurality of first gas supply holes, through which a first gas is supplied to the one or more substrates, arranged over an entirety of the process region; a second nozzle provided with a plurality of second gas supply holes, through which a second gas reacting with the first gas is supplied to the one or more substrates, arranged over the entirety of the process region; a third nozzle provided with one or more third gas supply holes, through which an adsorption inhibitory gas inhibiting an adsorption of the first gas is supplied to the one or more substrates, arranged corresponding to a part of the process region; and a gas supply system capable of supplying the first gas, the second gas and the adsorption inhibitory gas to the one or more substrates through the first nozzle, the second nozzle and the third nozzle, respectively.

BRIEF DESCRIPTION OF THE DRAWINGS

FIGS. 7A through 7C are diagrams schematically illustrating modified examples of the third nozzle according to the embodiments of the present disclosure.

DETAILED DESCRIPTION

Embodiments

Figure 1:
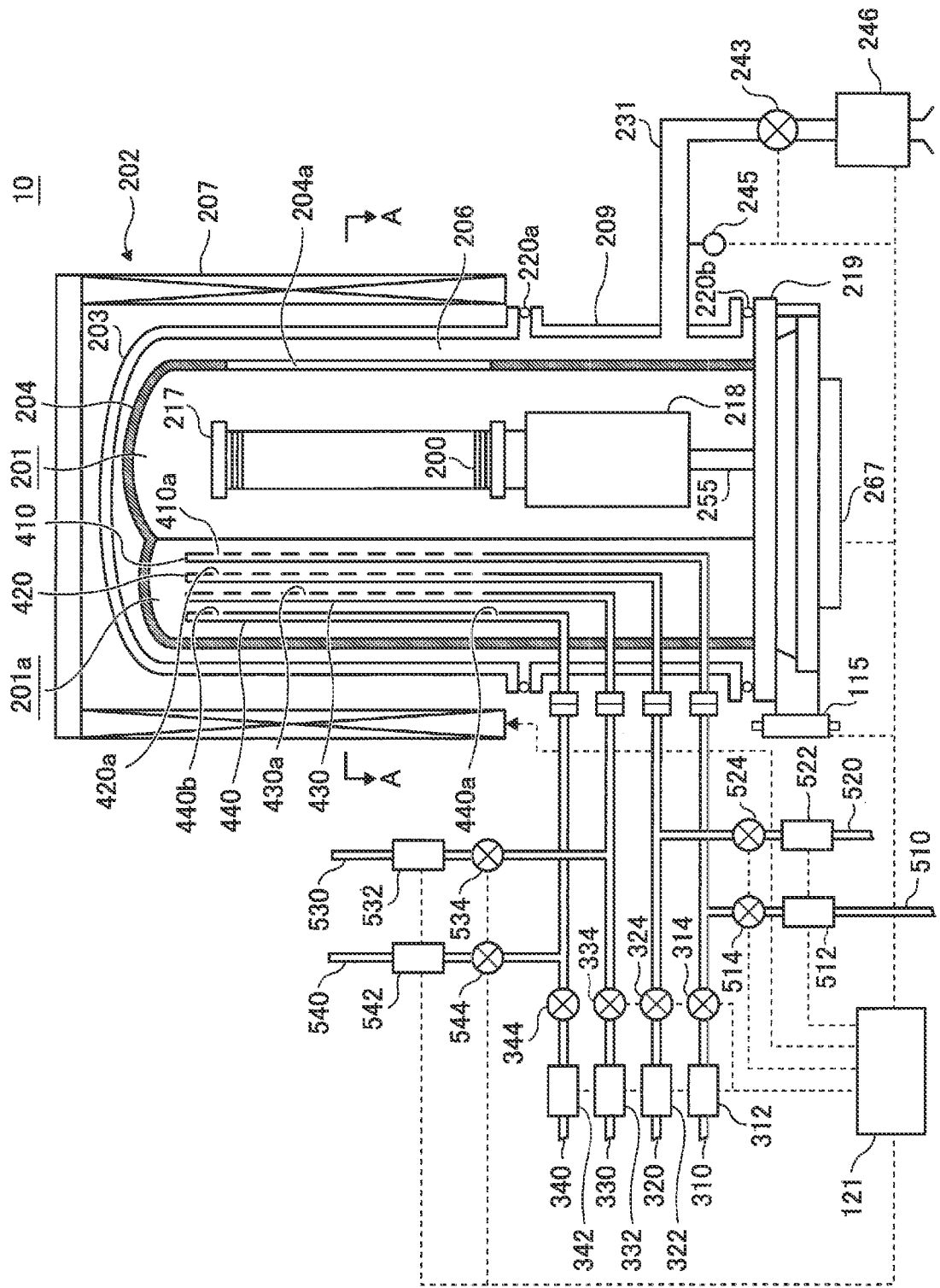
FIG. 1 is a diagram schematically illustrating a vertical cross-section of a vertical type process furnace of a substrate processing apparatus according to one or more embodiments of the present disclosure.

Hereinafter, one or more embodiments (also simply referred to as "embodiments") according to the technique of the present disclosure will be described with reference to FIGS. 1 through 6. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

A substrate processing apparatus 10 includes a process furnace 202. The process furnace 202 is provided with a heater 207 serving as a heating apparatus (which is a heating structure or a heating system). The heater 207 is of a cylindrical shape, and is vertically installed while being supported by a heater base (not shown) serving as a support plate.

An outer tube 203 constituting a process vessel is provided in an inner side of the heater 207 to be aligned in a manner concentric with the heater 207. For example, the outer tube 203 is made of a heat resistant material such as quartz ($SiO_2$) and silicon carbide (SiC). For example, the outer tube 203 is of a cylindrical shape with a closed upper end and an open lower end. A manifold (which is an inlet flange) 209 is provided under the outer tube 203 to be aligned in a manner concentric with the outer tube 203. For example, the manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the process vessel is provided in an inner side of the outer tube 203. For example, the inner tube 204 is made of a heat resistant material such as quartz ($SiO_2$) and silicon carbide (SiC). For example, the inner tube 204 is of a cylindrical shape with a closed upper end and an open lower end. The process vessel is constituted mainly by the outer tube 203, the inner tube 204 and the manifold 209. A process chamber 201 is provided in (or defined by) a hollow cylindrical portion of the process vessel (that is, an inner side of the inner tube 204).

The process chamber 201 is configured to stack and accommodate a plurality of wafers including a wafer 200 serving as a substrate in a horizontal orientation by a multistage manner along a vertical direction by a boat 217 serving as a substrate retainer described later. Hereinafter, the plurality of wafers including the wafer 200 may also be simply referred to as wafers 200. A process region in which the wafers 200 are processed is provided in the process chamber 201 in the process vessel.

A nozzle 410 serving as a first nozzle, a nozzle 420 serving as a second nozzle, a nozzle 430 serving as a fourth nozzle and a nozzle 440 serving as a third nozzle are installed in the process chamber 201 so as to penetrate a side wall of the manifold 209 and the inner tube 204. Each of the nozzles 410, 420, 430 and 440 may be implemented as an L-shaped nozzle, and is provided along an inner wall of the inner tube 204. Gas supply pipes 310, 320, 330 and 340 are connected to the nozzles 410, 420, 430 and 440, respectively.

A seal cap 219 serving as a furnace opening lid capable of airtightly sealing a lower end opening of the manifold 209 is provided under the manifold 209. The seal cap 219 is in contact with the lower end of the manifold 209 from thereunder. For example, the seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 accommodated in the boat 217 are rotated. The seal cap 219 may be elevated or lowered in the vertical direction by a boat elevator 115 serving as an elevator vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as the substrate retainer is configured to accommodate (support) the wafers 200 (for example, 25 to 200 wafers) while the wafers 200 are horizontally oriented with their centers aligned with each other with a predetermined interval therebetween in a multistage manner. For example, the boat 217 is made of a heat resistant material such as quartz and SiC. A plurality of heat insulating plates including a heat insulating plate 218 horizontally oriented are provided under the boat 217 in a multistage manner (not shown). The heat insulating plate 218 is made of a heat resistant material such as quartz and SiC. With such a configuration, the heat insulating plate 218 suppresses the transmission of the heat from the heater 207 to the seal cap 219. However, the present embodiments are not limited thereto. For example, instead of the heat insulating plate 218, a heat insulating cylinder (not shown) such as a cylinder made of a heat resistant material such as quartz and SiC may be provided under the boat 217.

Figure 2:
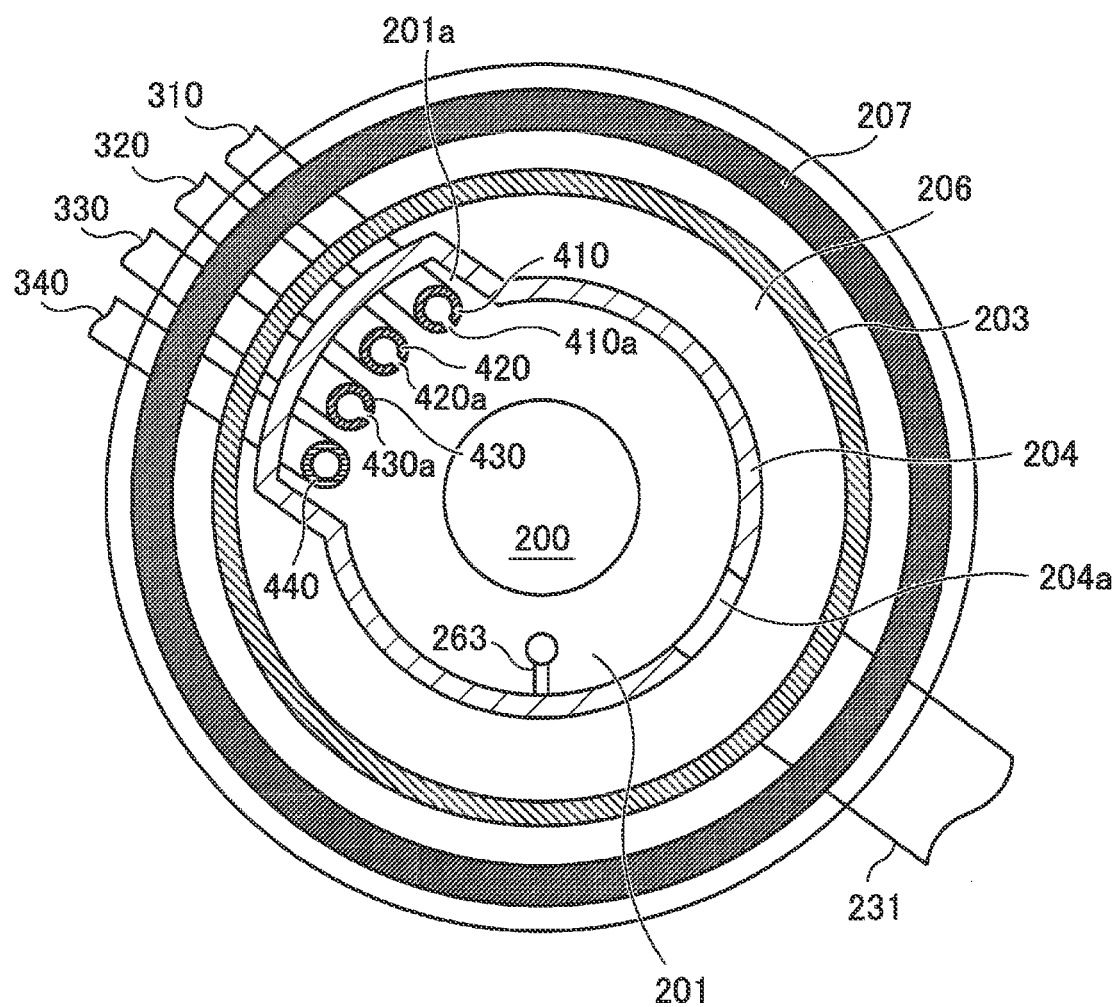
FIG. 2 is a diagram schematically illustrating a horizontal cross-section taken along the line A-A of the vertical type process furnace of the substrate processing apparatus shown in FIG. 1.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420, 430 and 440, the temperature sensor 263 is L-shaped, and is provided along the inner wall of the inner tube 204.

Mass flow controllers (MFCs) 312, 322, 332 and 342 serving as flow rate controllers (flow rate control structures) and valves 314, 324, 334 and 344 serving as opening/closing valves are sequentially installed at the gas supply pipes 310, 320, 330 and 340 in this order from upstream sides to downstream sides of the gas supply pipes 310, 320, 330 and 340, respectively, in a gas flow direction. Gas supply pipes 510, 520, 530 and 540 through which an inert gas is supplied are connected to the gas supply pipes 310, 320, 330 and 340 at downstream sides of the valves 314, 324, 334 and 344, respectively. Mass flow controllers (MFCs) 512, 522, 532 and 542 serving as flow rate controllers (flow rate control structures) and valves 514, 524, 534 and 544 serving as opening/closing valves are sequentially installed at the gas supply pipes 510, 520, 530 and 540 in this order from upstream sides to downstream sides of the gas supply pipes 510, 520, 530 and 540 respectively, in the gas flow direction.

The nozzles 410, 420, 430 and 440 are connected to front ends (tips) of the gas supply pipes 310, 320, 330 and 340, respectively. As described above, each of the nozzles 410, 420, 430 and 440 may be implemented as an L-shaped nozzle, and a horizontal portion of each of the nozzles 410, 420, 430 and 440 is installed so as to penetrate the side wall of the manifold 209 and the inner tube 204. A vertical portion of each of the nozzles 410, 420, 430 and 440 is installed in a spare chamber 201a of a channel shape (a groove shape) protruding outward in a radial direction of the inner tube 204 and extending in the vertical direction. That is, the vertical portion of each of the nozzles 410, 420, 430 and 440 is installed in the spare chamber 201a to extend toward an upper portion of the inner tube 204 (in a direction in which the wafers 200 are stacked) and along the inner wall of the inner tube 204.

A first gas containing a halogen element serving as a process gas is supplied into the process chamber 201 through the gas supply pipe 310 provided with the MFC 312 and the valve 314 and the nozzle 410.

A second gas (which is a reducing gas) serving as the process gas is supplied into the process chamber 201 through the gas supply pipe 320 provided with the MFC 322 and the valve 324 and the nozzle 420. In the present specification, the second gas is used as a reactive gas capable of reducing and reacting with the first gas.

A third gas (which is a reducing gas different from the second gas) serving as the process gas is supplied into the process chamber 201 through the gas supply pipe 330 provided with the MFC 332 and the valve 334 and the nozzle 430.

An adsorption inhibitory gas (which contains a halogen element of the same type as the halogen element contained in the first gas and inhibits an adsorption of the first gas) is supplied into the process chamber 201 through the gas supply pipe 340 provided with the MFC 342 and the valve 344 and the nozzle 440. According to the present embodiments, as the adsorption inhibitory gas, it is preferable to use a gas containing the same composition as reaction by-products generated by a reaction between the first gas and the second gas.

The inert gas such as nitrogen ($N_2$) gas is supplied into the process chamber 201 through the gas supply pipes 510, 520, 530 and 540 provided with the MFCs 512, 522, 532 and 542 and the valves 514, 524, 534 and 544, respectively, and the nozzles 410, 420, 430 and 440. While the present embodiments will be described by way of an example in which the $N_2$ gas is used as the inert gas, the inert gas according to the present embodiments is not limited thereto. For example, instead of the $N_2$ gas, a rare gas such as argon (Ar) gas, helium (He) gas, neon (Ne) gas and xenon (Xe) gas may be used as the inert gas.

The nozzles 410, 420, 430 and 440 are provided so as to extend from a lower region to an upper region of the process chamber 201.

The nozzles 410, 420 and 430 are provided with a plurality of gas supply holes 410a serving as first holes, a plurality of gas supply holes 420a and a plurality of gas supply holes 430a, respectively, at positions facing the wafers 200. The gas supply holes 420a and the gas supply holes 430a serve as second holes. The gas supply holes 410a, the gas supply holes 420a and the gas supply holes 430a are provided from a lower portion to the upper portion of the inner tube 204. Opening areas of the gas supply holes 410a are equal to one another, opening areas of the gas supply holes 420a are equal to one another, and opening areas of the gas supply holes 430a are equal to one another. Further, the gas supply holes 410a are provided at the same pitch therebetween, the gas supply holes 420a are provided at the same pitch therebetween, and the gas supply holes 430a are provided at the same pitch therebetween. However, the configurations of the gas supply holes 410a, the gas supply holes 420a and the gas supply holes 430a are not limited thereto. For example, the opening areas of the gas supply holes 410a, the gas supply holes 420a or the gas supply holes 430a may gradually increase from the lower portion to the upper portion of the inner tube 204 to further uniformize a flow rate of a gas supplied through the gas supply holes 410a, the gas supply holes 420a or the gas supply holes 430a.

The gas supply holes 410a of the nozzle 410, the gas supply holes 420a of the nozzle 420 and the gas supply holes 430a of the nozzle 430 are provided from a lower portion to an upper portion of the boat 217. In other words, the nozzle 410 is provided with the gas supply holes 410a through which the first gas is supplied wherein the gas supply holes 410a are arranged over the entirety (more precisely, over the entire vertical range) of the process region where the wafers 200 are processed; the nozzle 420 is provided with the gas supply holes 420a through which the second gas is supplied wherein the gas supply holes 420a are arranged over the entirety (more precisely, over the entire vertical range) of the process region; and the nozzle 430 is provided with the gas supply holes 430a through which the third gas is supplied wherein the gas supply holes 430a are arranged over the entirety (more precisely, over the entire vertical range) of the process region. Therefore, the first gas, the second gas and the third gas supplied into the process chamber 201 through the gas supply holes 410a of the nozzle 410, the gas supply holes 420a of the nozzle 420 and the gas supply holes 430a of the nozzle 430, respectively, are supplied onto the wafers 200 accommodated in the boat 217 from the lower portion to the upper portion thereof, that is, the entirety of the wafers 200 accommodated in the boat 217. It would be sufficient for the nozzles 410, 420 and 430 to extend across the entire process region from the lower region to the upper region of the process chamber 201. However, it is more preferable that the nozzles 410, 420 and 430 extend to the vicinity of a ceiling of the boat 217.

Figure 3:
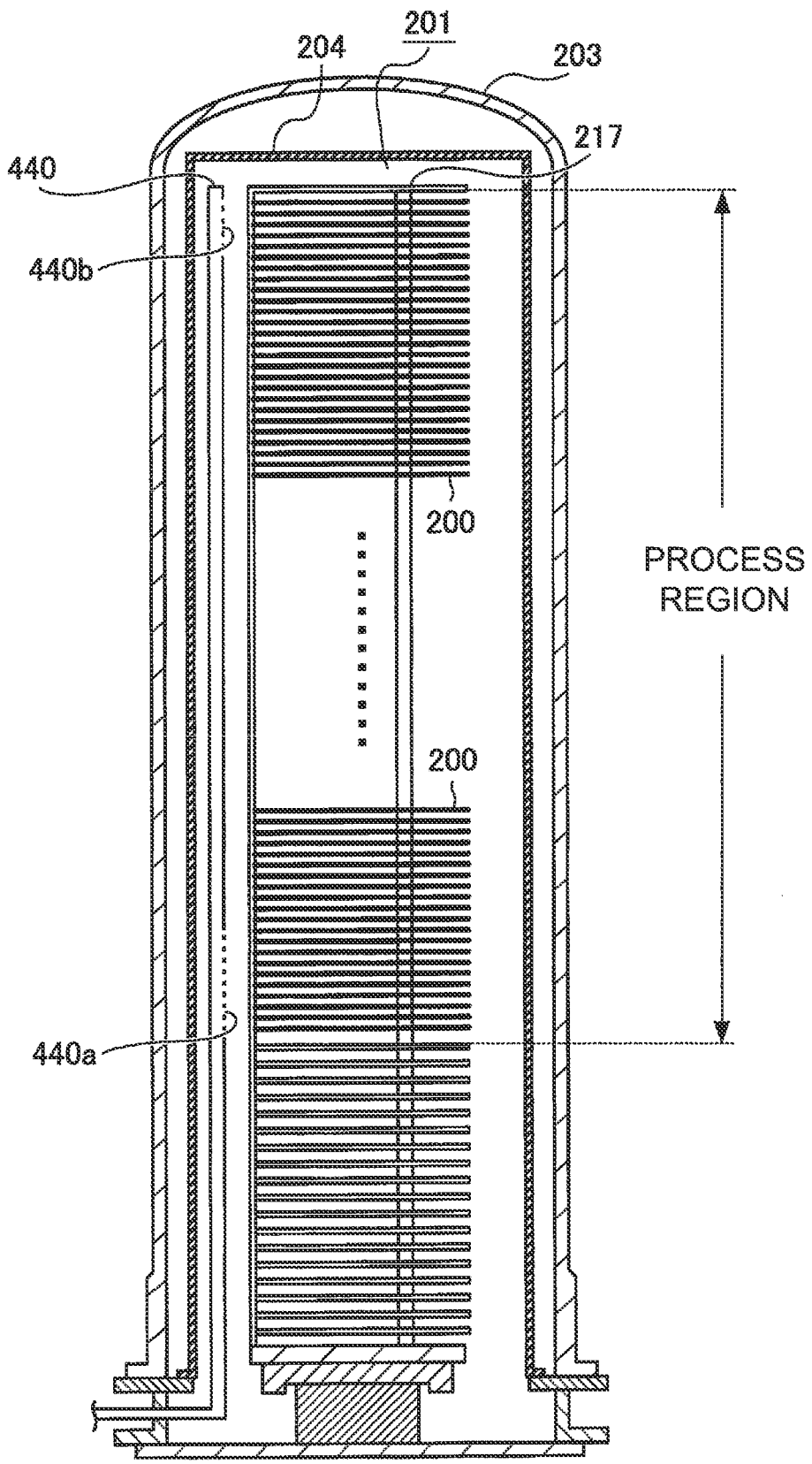
FIG. 3 is a diagram schematically illustrating arrangement positions of a plurality of holes of a third nozzle with respect to a process region of a substrate in one embodiment of the present disclosure.

As shown in FIG. 3, the nozzle 440 is provided with one or more gas supply holes 440a or a plurality of gas supply holes 440a. Hereinafter, the descriptions will be presented related to the plurality of holes 440a for simplicity, but those may also be applied to the one or more holes 440a. The plurality of gas supply holes 440a serve as third holes and are arranged in a lower region of the process region (which is a part of the process region in which the wafers 200 are processed) at positions corresponding to lower wafers among the wafers 200 located in a lower end portion of the process region. In addition, the nozzle 440 is provided with a plurality of gas supply holes 440b that serve as fourth holes and are arranged in an upper region of the process region (which is another part of the process region) at positions corresponding to upper wafers among the wafers 200 located in an upper end portion of the process region. That is, the plurality of gas supply holes 440a are arranged in a lower end portion of the nozzle 440 in the process region, and the plurality of gas supply holes 440b are arranged in an upper end portion of the nozzle 440 in the process region.

That is, the gas supply holes 440a and the gas supply holes 440b are provided at positions of the nozzle 440 corresponding to respective parts of the process region, and the adsorption inhibitory gas passed through the gas supply holes 440a and the gas supply holes 440b into the process chamber 201 is supplied to some of the wafers 200 accommodated in the boat 217.

When a film is formed on a product substrate serving as a product wafer (hereinafter, also simply referred to as a "wafer") using the process gas, the number of product substrates in the upper end portion or the lower end portion of the process region is smaller than the number of product substrates in a central portion of the process region. Thereby, an amount of the reaction by-products is reduced in the upper end portion or the lower end portion of the process region as compared with the central portion of the process region. Therefore, a thickness of the film formed on the product substrate in the upper end portion or the lower end portion of the process region may be thicker than the thickness of the film formed on the product substrate in the central portion of the process region. As a result, a uniformity between substrates may be deteriorated. In addition, when a dummy wafer is provided in the upper end portion or the lower end portion of the boat 217, a surface area of the dummy wafer is smaller than a surface area of the product substrate, so that the amount of the reaction by-products is reduced in the upper end portion or the lower end portion of the process region. Therefore, the thickness of the film formed on the product substrate in the upper end portion or the lower end portion of the process region may be thicker than the thickness of the film formed on the product substrate in the central portion of the process region. This also may cause a deterioration in the uniformity between substrates. Such a phenomenon becomes remarkable when the surface area of the product substrate is large.

According to the present embodiments, as the adsorption inhibitory gas, a gas containing the same component as the reaction by-products generated by the reaction between the first gas and the second gas is supplied to the upper end portion and the lower end portion of the process region (where the amount of the reaction by-products is small as compared with other portions of the process region). Thereby, it possible to uniformize the amount of the reaction by-products over the entire process region. Therefore, it is possible to reduce the thickness of the film formed on the upper and lower wafers among the wafers 200 located in the upper end portion and the lower end portion of the process region, and also to improve a thickness uniformity of the films throughout the wafers 200. It is also possible to uniformize characteristics of the films formed on the wafers 200.

Opening areas of the gas supply holes 440a are equal to one another, opening areas of the gas supply holes 440b are equal to one another, the gas supply holes 440a are provided at the same pitch therebetween, and the gas supply holes 440b are provided at the same pitch therebetween. In addition, an opening ratio of the gas supply holes 440a is set to be greater than an opening ratio of the gas supply holes 440b. In the present embodiments, the opening ratio of the gas supply holes 440a (or 440b) is determined by the number of the gas supply holes 440a (or 440b), a size of each of the gas supply holes 440a or 440b and a product of the number of the gas supply holes 440a or 440b and the size of each of the gas supply holes 440a (or 440b). That is, one or both of the number the gas supply holes 440a and the size of each of the gas supply holes 440a are set to be greater than one or both of the number of the gas supply holes 440b and the size of each of the gas supply holes 440b. The dummy wafer may be provided in the lower end portion of the process region. In such a case, the surface area of the dummy wafer is smaller than a surface area of the wafer 200 serving as the product substrate, so that the amount of the reaction by-products is reduced in the lower end portion of the process region where the dummy wafer is provided as compared with the upper end portion of the process region. As a result, the thickness of the film formed on a lower wafer among the wafers 200 located in the lower end portion of the process region may be thicker than the thickness of the film formed on a middle wafer among the wafers 200 located in the central portion of the process region. Therefore, the opening ratio of the gas supply holes 440a arranged in the lower end portion of the process region is set to be greater than the opening ratio of the gas supply holes 440b arranged in the upper portion of the process region such that an amount of the adsorption inhibitory gas supplied to the lower end portion of the process region is greater than the amount of the adsorption inhibitory gas supplied to the upper end portion of the process region.

That is, the gas supply holes 440a are provided at positions corresponding to the lower wafers among the wafers 200 located in the lower end portion of the process region, and the gas supply holes 440b are provided at positions corresponding to the upper wafers among the wafers 200 located in the upper end portion of the process region. Thereby, the adsorption inhibitory gas is supplied only to those wafers among the wafers 200 located in the lower end portion or in the upper end portion of the process region, wherein the amount of the reaction by-products in each of the lower end portion and the upper end portion is small as compared with the central portion of the process region. In addition, by setting the opening ratio of the gas supply holes 440a in the lower end portion of the process region greater than that of the gas supply holes 440b in the upper end portion of the process region, the amount of the adsorption inhibitory gas supplied to the lower end portion of the process region (where the amount of the reaction by-products is small as compared with the upper end portion of the process region) exceeds the amount of the adsorption inhibitory gas supplied to the upper end portion of the process region. As a result, it is possible to improve a processing uniformity between the wafers 200. Therefore, it is possible to reduce the thickness of the film formed on the wafers 200 (especially those densely arranged) in the process region, and also to improve the thickness uniformity of the films formed on the wafers 200. It is also possible to uniformize the characteristics of the films formed on the wafers 200.

A process gas supplier (which is a process gas supply structure) is constituted by the gas supply pipes 310, 320 and 330, the MFCs 312, 322 and 332, the valves 314, 324 and 334 and the nozzles 410, 420 and 430. However, only the nozzles 410, 420 and 430 may be considered as the process gas supplier. The process gas supplier may also be simply referred to as a "gas supplier" (which is a gas supply structure). When the first gas is supplied through the gas supply pipe 310, a first gas supplier (which is a first gas supply structure) is constituted mainly by the gas supply pipe 310, the MFC 312 and the valve 314. The first gas supplier may further include the nozzle 410. In addition, when the second gas is supplied through the gas supply pipe 320, a second gas supplier (which is a second gas supply structure) is constituted mainly by the gas supply pipe 320, the MFC 322 and the valve 324. The second gas supplier may further include the nozzle 420. Further, the second gas supplier may also be referred to as a "reactive gas supplier" which is a reactive gas supply structure or a "reducing gas supplier" which is a reducing gas supply structure. In addition, when the third gas is supplied through the gas supply pipe 330, a third gas supplier (which is a third gas supply structure) is constituted mainly by the gas supply pipe 330, the MFC 332 and the valve 334. The third gas supplier may further include the nozzle 430. Further, the third gas supplier may also be referred to as a "reducing gas supplier" which is a reducing gas supply structure. In addition, when the adsorption inhibitory gas is supplied through the gas supply pipe 340, an adsorption inhibitory gas supplier (which is an adsorption inhibitory gas supply structure) is constituted mainly by the gas supply pipe 340, the MFC 342 and the valve 344. The adsorption inhibitory gas supplier may further include the nozzle 440. In addition, an inert gas supplier (which is an inert gas supply structure) is constituted mainly by the gas supply pipes 510, 520, 530 and 540, the MFCs 512, 522, 532 and 542 and the valves 514, 524, 534 and 544.

A gas supply system through which the first gas, the second gas, the third gas and the adsorption inhibitory gas can be supplied to the wafer 200 via the nozzle 410, the nozzle 420, the nozzle 430 and the nozzle 440, respectively, is constituted by the first gas supplier, the second gas supplier, the third gas supplier and the adsorption inhibitory gas supplier.

According to the present embodiments, the gas is supplied through the nozzles 410, 420, 430 and 440 provided in a vertically long annular space (which is defined by the inner wall of the inner tube 204 and edges (peripheries) of the wafers 200) in the spare chamber 201a. Then, the gas is ejected into the inner tube 204 through the gas supply holes 410a of the nozzle 410, the gas supply holes 420a of the nozzle 420, the gas supply holes 430a of the nozzle 430 and the gas supply holes 440a and the gas supply holes 440b of the nozzle 440 provided at positions facing the wafers 200. Specifically, the gas such as the first gas, the second gas, the third gas and the adsorption inhibitory gas is ejected into the inner tube 204 in a direction parallel to surfaces of the wafers 200 through the gas supply holes 410a of the nozzle 410, the gas supply holes 420a of the nozzle 420, the gas supply holes 430a of the nozzle 430 and the gas supply holes 440a and the gas supply holes 440b of the nozzle 440.

An exhaust hole (exhaust port) 204a is a through-hole facing the nozzles 410, 420, 430 and 440, and is provided at a side wall of the inner tube 204. For example, the exhaust hole 204a may be of a narrow slit-shaped through-hole elongating vertically. The gas supplied into the process chamber 201 through the gas supply holes 410a of the nozzle 410, the gas supply holes 420a of the nozzle 420, the gas supply holes 430a of the nozzle 430 and the gas supply holes 440a and the gas supply holes 440b of the nozzle 440 flows over the surfaces of the wafers 200. Then, the gas that has flowed over the surfaces of the wafers 200 is exhausted through the exhaust hole 204a into an exhaust path 206 formed in a gap between the inner tube 204 and the outer tube 203. The gas flowing in the exhaust path 206 flows into an exhaust pipe 231 and is then discharged (exhausted) out of the process furnace 202.

The exhaust hole 204a is provided at a location facing the wafers 200. The gas supplied into the vicinity of the wafers 200 in the process chamber 201 through the gas supply holes 410a, the gas supply holes 420a, the gas supply holes 430a, the gas supply holes 440a and the gas supply holes 440b flows in a horizontal direction. The gas that has flowed in the horizontal direction is exhausted through the exhaust hole 204a into the exhaust path 206. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially connected to the exhaust pipe 231 in this order from an upstream side to a downstream side of the exhaust pipe 231. With the vacuum pump 246 in operation, the APC valve 243 may be opened or closed to perform a vacuum exhaust of the process chamber 201 or stop the vacuum exhaust. With the vacuum pump 246 in operation, an opening degree of the APC valve 243 may be adjusted in order to adjust the inner pressure of the process chamber 201. An exhauster (which is an exhaust structure) is constituted mainly by the exhaust hole 204a, the exhaust path 206, the exhaust pipe 231, the APC valve 243 and the pressure sensor 245. The exhauster may further include the vacuum pump 246.

Figure 4:
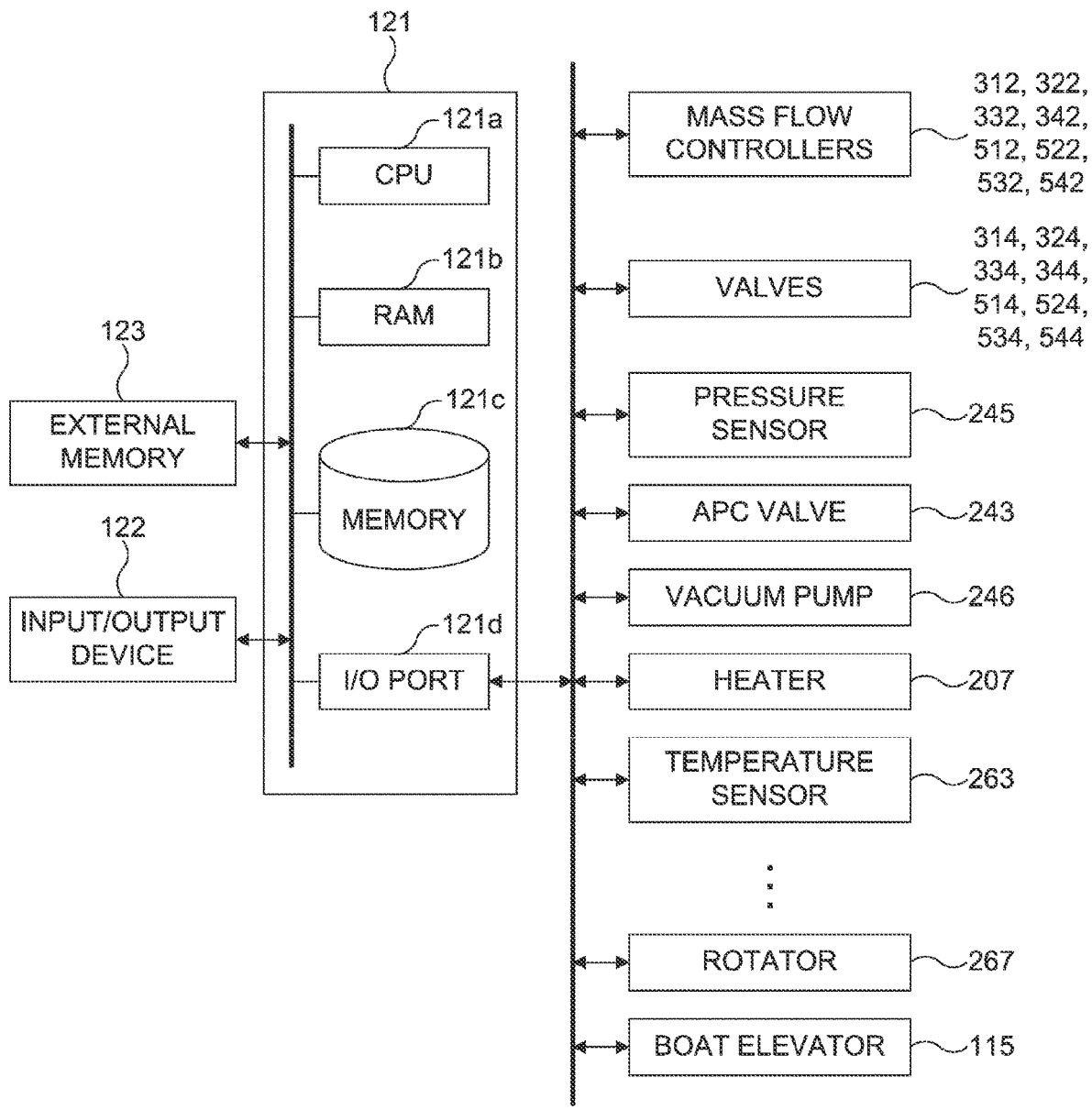
FIG. 4 is a block diagram schematically illustrating a configuration of a controller and related components of the substrate processing apparatus according to the embodiments of the present disclosure.

As shown in FIG. 4, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus (not shown). For example, an input/output device 122 such as a touch panel is connected to the controller 121.

The memory 121c is configured by a component such as a flash memory and a hard disk drive (HDD). For example, a control program configured to control the operation of the substrate processing apparatus 10 or a process recipe containing information on sequences and conditions of a method of manufacturing a semiconductor device described later is readably stored in the memory 121c. The process recipe is obtained by combining steps of the method of manufacturing the semiconductor device described later such that the controller 121 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121b functions as a memory area (work area) where a program or data read by the CPU 121a is temporarily stored.

The I/O port 121d is connected to the above-described components such as the MFCs 312, 322, 332, 342, 512, 522, 532 and 542, the valves 314, 324, 334, 344, 514, 524, 534 and 544, the pressure sensor 245, the APC valve 243, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read a recipe such as the process recipe from the memory 121c in accordance with an operation command inputted from the input/output device 122. According to the contents of the read recipe, the CPU 121a may be configured to be capable of controlling various operations such as flow rate adjusting operations for various gases by the MFCs 312, 322, 332, 342, 512, 522, 532 and 542, opening and closing operations of the valves 314, 324, 334, 344, 514, 524, 534 and 544, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217. That is, the CPU 121a is configured to be capable of controlling the gas supply system according to the present embodiments.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a "recording medium". In the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

(2) Substrate Processing (Film-Forming Process)

Hereinafter, as a part of a manufacturing process of the semiconductor device (that is, the method of manufacturing the semiconductor device), an example of a substrate processing of forming a film on the wafers 200 will be described with reference to FIG. 5. The substrate processing of forming the film is performed using the process furnace 202 of the substrate processing apparatus 10 described above. In the following description, the operations of the components constituting the substrate processing apparatus 10 are controlled by the controller 121. In particular, it is possible for the controller 121 to control the gas supply system.

According to the substrate processing serving as a part of the manufacturing process of the semiconductor device may include: (a) supplying the first gas to the wafers 200; (b) supplying the second gas to the wafers 200; (c) supplying the adsorption inhibitory gas to the wafers 200; (d) supplying the third gas to the wafers 200; and (e) performing (a) and (d) partially in parallel, then performing (c) and then performing (b).

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". In the present specification, the terms "substrate" and "wafer" may be used as substantially the same meaning. That is, the term "substrate" may be substituted by "wafer" and vice versa.

Wafer Charging Step and Boat Loading Step

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 (boat loading step), and then becomes accommodated in the process vessel. With the boat 217 loaded into the process chamber 201, the seal cap 219 seals a lower end opening of the outer tube 203 (that is, the lower end opening of the manifold 209) via the O-ring 220b.

Pressure Adjusting Step and Temperature Adjusting Step

The vacuum pump 246 vacuum-exhausts the inner atmosphere of the process chamber 201 (that is, a space in which the wafers 200 are accommodated) until the inner pressure of the process chamber 201 reaches and is maintained at a desired pressure (vacuum degree). When the vacuum pump 246 vacuum-exhausts the inner atmosphere of the process chamber 201, the inner pressure of the process chamber 201 is measured by the pressure sensor 245, and the APC valve 243 is feedback-controlled based on pressure information measured by the pressure sensor 245 (pressure adjusting step). The vacuum pump 246 continuously vacuum-exhausts the inner atmosphere of the process chamber 201 until at least a processing (that is, the substrate processing) of the wafer 200 is completed. In addition, the heater 207 heats the process chamber 201 until the inner temperature of the process chamber 201 reaches and is maintained at a desired temperature. When the heater 207 heats the process chamber 201, the amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

First Gas Supply Step (First Step)

The valve 314 is opened to supply the first gas into the gas supply pipe 310. A flow rate of the first gas supplied into the gas supply pipe 310 is adjusted by the MFC 312. The first gas whose flow rate is adjusted is then supplied into the process chamber 201 through the gas supply holes 410a of the nozzle 410, and is exhausted through the exhaust pipe 231. When the first gas is supplied, simultaneously, the valve 514 may be opened to supply the inert gas such as the $N_2$ gas into the gas supply pipe 510. In addition, in order to prevent the first gas from entering the nozzles 420, 430 and 440, the valves 524, 534 and 544 may be opened to supply the inert gas into the gas supply pipes 520, 530 and 540.

In the first step, for example, the APC valve 243 is appropriately adjusted (controlled) to adjust the inner pressure of the process chamber 201 to a pressure within a range of 1 Pa to 3,990 Pa. For example, a supply flow rate of the first gas controlled by the MFC 312 may be set to a flow rate within a range of 0.01 slm to 7.0 slm. Hereinafter, for example, a temperature of the heater 207 may be set such that a temperature of the wafer 200 reaches and is maintained at a temperature within a range of 300° C. to 650° C. In the present specification, a notation of a numerical range such as "1 Pa to 3,990 Pa" means that a lower limit and an upper limit are included in the numerical range. Therefore, for example, the numerical range "1 Pa to 3,990 Pa" means a range equal to or higher than 1 Pa and equal to or lower than 3,990 Pa. The same also applies to other numerical ranges described herein.

In the first step, the first gas is supplied to the wafers 200 in the entire process region. As described above, the first gas contains a halogen element. For example, $TiCl_4$ gas, which is a gas containing titanium serving as a metal element and chlorine (Cl) serving as a halogen element, may be used as the first gas. When the $TiCl_4$ gas is used as the first gas, by supplying the $TiCl_4$ gas, $TiCl_4$ is adsorbed on the wafer 200. As a result, a titanium-containing layer is formed on the wafer 200 (that is, on a base film on the surface of the wafer 200).

First Gas and Third Gas Supply Step (Second Step)

When a predetermined time has elapsed after a supply of the first gas is started, the valve 334 is opened to supply the third gas (which is a reducing gas different from the second gas) into the gas supply pipe 330. A flow rate of the third gas supplied into the gas supply pipe 330 is adjusted by the MFC 332. The third gas whose flow rate is adjusted is then supplied into the process chamber 201 through the gas supply holes 430a of the nozzle 430, and is exhausted through the exhaust pipe 231. When the third gas is supplied, simultaneously, the valve 534 may be opened to supply the inert gas such as the $N_2$ gas into the gas supply pipe 530. In addition, in order to prevent the first gas and the third gas from entering the nozzles 420 and 440, the valves 524 and 544 may be opened to supply the inert gas into the gas supply pipes 520 and 540.

In the second step, for example, a supply flow rate of the third gas controlled by the MFC 332 may be set to a flow rate within a range of 0.1 slm to 5.0 slm.

In the second step, the first gas and the third gas are supplied to the wafers 200 in the entire process region. That is, in the second step, there is a timing at which the first gas and the third gas are simultaneously supplied. According to the present embodiments, a hydrogen-containing gas serving as the reducing gas may be used as the third gas. For example, monosilane (SiH$_4$) gas may be used as the hydrogen-containing gas.

First Gas Supply Step (Third Step)

When a predetermined time has elapsed after a supply of the third gas is started, the valve 334 is closed to stop the supply of the third gas into the process chamber 201. In the third step, in order to prevent the first gas from entering the nozzles 430, the valve 534 may be opened to supply the inert gas into the gas supply pipe 530. In addition, in order to prevent the first gas from entering the nozzles 420 and 440, the valves 524 and 544 may be opened to supply the inert gas into the gas supply pipes 520 and 540. In the third step, the first gas is supplied to the wafers 200 in the entire process region.

Purge Step (Fourth Step)

When a predetermined time has elapsed after the supply of the third gas is stopped, the valve 314 is closed to stop the supply of the first gas. In the fourth step, with the APC valve 243 of the exhaust pipe 231 open, the vacuum pump 246 vacuum-exhausts the inner atmosphere of the process chamber 201 to remove a residual gas on the wafers 200 and to remove a substance remaining in the process chamber 201 such as the first gas or the third gas which did not react and the reaction by-products out of the process chamber 201. In the fourth step, with the valves 514, 524, 534 and 544 open, the inert gas serving as a purge gas is supplied into the process chamber 201. The inert gas serves as the purge gas, which improves the efficiency of removing the residual gas on the wafers 200 and the substance remaining in the process chamber 201 such as the first gas or the third gas which did not react and the reaction by-products out of the process chamber 201. For example, supply flow rates of the inert gas controlled by the MFCs 512, 522, 532 and 542 may be set to flow rates within a range of 0.1 slm to 30 slm, respectively.

Adsorption Inhibitory Gas Supply Step (Fifth Step)

When a predetermined time has elapsed after the fourth step is started, the valves 514, 524, 534 and 544 are closed to stop a supply of the inert gas into the process chamber 201. In the fifth step, the valve 344 is opened to supply the adsorption inhibitory gas into the gas supply pipe 340. A flow rate of the adsorption inhibitory gas supplied into the gas supply pipe 340 is adjusted by the MFC 342. The adsorption inhibitory gas whose flow rate is adjusted is then supplied into the process chamber 201 through the gas supply holes 440a and the gas supply holes 440b of the nozzle 440, and is exhausted through the exhaust pipe 231.

In the fifth step, for example, a supply flow rate of the adsorption inhibitory gas controlled by the MFC 342 may be set to a flow rate within a range of 0.01 slm to 1.0 slm.

In the fifth step, the adsorption inhibitory gas is supplied to the upper wafers among the wafers 200 located in the upper end portion and the lower end portion of the process region, which are parts of the process region. According to the present embodiments, as the adsorption inhibitory gas, a gas containing a halogen element of the same type as the halogen element contained in the first gas and containing the same composition as the reaction by-products generated by the reaction between the TiCl$_4$ gas serving as the first gas and NH$_3$ gas serving as the second gas may be used. For example, a gas such as hydrogen chloride (HCl) gas and ammonium chloride (NH$_4$Cl) gas may be used as the adsorption inhibitory gas. For example, when the HCl gas is used as the adsorption inhibitory gas, by supplying the HCl gas, HCl (which inhibits an adsorption of the TiCl$_4$ gas) is adsorbed on the upper and lower wafers among the wafers 200 (more specifically, on base films on their surfaces) located in the upper end portion and the lower end portion of the process region.

As described above, as the adsorption inhibitory gas, by using the gas containing the halogen element of the same type as the halogen element contained in the first gas, or preferably by using the gas containing the halogen element of the same type as the halogen element contained in the first gas and containing the same composition as the reaction by-products generated by the reaction between the first gas and the second gas, it is possible to suppress the adsorption inhibitory gas from remaining in the film.

That is, even though the adsorption inhibitory gas is unlikely to remain in the film, it is possible for the adsorption inhibitory gas to remain in the film depending on the conditions of the substrate processing or a gas type of the adsorption inhibitory gas and to thereby affect the characteristics of the film such as the electrical characteristics of the film. However, when the gas containing the same composition as the reaction by-products generated by the reaction between the first gas and the second gas is used as the adsorption inhibitory gas, it is possible to reduce the possibility that the adsorption inhibitory gas affects other films constituting the semiconductor device. For example, if hydrogen fluoride (HF) gas is supplied as the adsorption inhibitory gas when forming a titanium nitride film (TiN film), fluorine (F) may remain in the TiN film. As a result, a function of the TiN film as a fluorine barrier may deteriorate. In addition, when a base film of the TiN film is an aluminum oxide film (AlO film), fluorine may diffuse into the AlO film and an insulating property of the AlO film may deteriorate. As described above, when the gas containing the same composition as the reaction by-products generated by the reaction between the first gas and the second gas is used as the adsorption inhibitory gas, such a problem is less likely to occur.

In addition, in order to prevent the adsorption inhibitory gas from entering the nozzles 410, 420 and 430, the valves 514, 524 and 534 may be opened to supply the inert gas into the gas supply pipes 510, 520 and 530.

Purge Step (Sixth Step)

When a predetermined time has elapsed after a supply of the adsorption inhibitory gas is started, the valve 344 is closed to stop the supply of the adsorption inhibitory gas. In the sixth step, with the APC valve 243 of the exhaust pipe 231 open, the vacuum pump 246 vacuum-exhausts the inner atmosphere of the process chamber 201 to remove a residual gas on the wafers 200 and to remove a substance remaining in the process chamber 201 such as the adsorption inhibitory gas and the reaction by-products out of the process chamber 201. In the sixth step, with the valves 514, 524, 534 and 544 open, the inert gas serving as the purge gas is supplied into the process chamber 201. The inert gas serves as the purge gas, which improves the efficiency of removing the residual gas on the wafers 200 and the substance remaining in the process chamber 201 such as the adsorption inhibitory gas and the reaction by-products out of the process chamber 201. For example, the supply flow rates of the inert gas controlled by the MFCs 512, 522, 532 and 542 may be set to flow rates within a range of 0.1 slm to 30 slm, respectively.

Second Gas Supply Step (Seventh Step)

When a predetermined time has elapsed after the sixth step is started, the valves 514, 524, 534 and 544 are closed to stop the supply of the inert gas into the process chamber 201. In the seventh step, the valve 324 is opened to supply the second gas into the gas supply pipe 320. A flow rate of the second gas supplied into the gas supply pipe 320 is adjusted by the MFC 322. The second gas whose flow rate is adjusted is then supplied into the process chamber 201 through the gas supply holes 420a of the nozzle 420, and is exhausted through the exhaust pipe 231. In the seventh step, the second gas is supplied to the wafers 200. When the second gas is supplied, simultaneously, the valve 524 may be opened to supply the inert gas into the gas supply pipe 520. In addition, in order to prevent the second gas from entering the nozzles 410, 430 and 440, the valves 514, 534 and 544 may be opened to supply the inert gas into the gas supply pipes 510, 530 and 540.

In the seventh step, for example, the APC valve 243 is appropriately adjusted (controlled) to adjust the inner pressure of the process chamber 201 to a pressure within a range of 1 Pa to 3,990 Pa. For example, a supply flow rate of the second gas controlled by the MFC 322 may be set to a flow rate within a range of 0.1 slm to 150 slm.

In the seventh step, the second gas is supplied to the wafers 200 in the entire process region. According to the present embodiments, a gas containing nitrogen (N) and hydrogen (H) and serving as a reducing gas may be used as the second gas. For example, the ammonia ($NH_3$) gas may be used as the second gas. For example, when the $NH_3$ gas is used as the second gas and the $TiCl_4$ gas is used as the first gas, a substitution reaction occurs between the $NH_3$ gas and at least a portion of the titanium-containing layer formed on the wafer 200 in the first step. During the substitution reaction, titanium (Ti) contained in the titanium-containing layer and nitrogen contained in the $NH_3$ gas are bonded. As a result, a titanium nitride layer (TiN layer) containing titanium and nitrogen is formed on the wafer 200. Specifically, by reacting TiCl adsorbed on the wafer 200 with the $NH_3$ gas, the TiN layer is formed on the wafer 200. In addition, the reaction by-products such as HCl, $NH_4Cl$ and $H_2$ are generated during the substitution reaction.

By performing the fifth step described above, the adsorption inhibitory gas is adsorbed on the upper and lower wafers among the wafers 200 located in the upper end portion and the lower end portion of the process region. Thereby, the second gas does not react with the first gas. Specifically, after supplying the $TiCl_4$ gas serving as the first gas, the HCl gas serving as the adsorption inhibitory gas is supplied to the upper and lower wafers such that the HCl is adsorbed on the wafers among the wafers 200 in the upper end portion and the lower end portion of the process region. Thereby, the $NH_3$ gas serving as the second gas supplied thereafter does not react with the $TiCl_4$ gas, and the adsorption of the $TiCl_4$ gas is also inhibited in a next performance of a cycle described later. Therefore, the TiN layer is not formed on the wafers among the upper and lower wafers. Therefore, it is possible to lower a film-forming rate of the wafers among the upper and lower wafers 200 located in the upper end portion and the lower end portion of the process region to which the adsorption inhibitory gas is supplied. In addition, a part of the $NH_3$ gas reacts with the HCl gas serving as the adsorption inhibitory gas to generate the $NH_4Cl$. However, the $NH_4Cl$ does not remain in the film because it is desorbed from the wafers 200 without being adsorbed thereon. Therefore, the electrical characteristics of the film are less affected.

Purge Step (Eighth Step)

When a predetermined time has elapsed after the supply of the second gas is stopped, the valve 324 is closed to stop the supply of the second gas. In the eighth step, with the APC valve 243 of the exhaust pipe 231 open, the vacuum pump 246 vacuum-exhausts the inner atmosphere of the process chamber 201 to remove a residual gas on the wafers 200 and to remove a substance remaining in the process chamber 201 such as the second gas which did not react or which contributed to the formation of the TiN layer and the reaction by-products out of the process chamber 201. In the eighth step, with the valves 514, 524, 534 and 544 open, the inert gas serving as the purge gas is supplied into the process chamber 201. The inert gas serves as the purge gas, which improves the efficiency of removing the residual gas on the wafers 200 and the substance remaining in the process chamber 201 such as the second gas which did not react or which contributed to the formation of the TiN layer and the reaction by-products out of the process chamber 201. For example, the supply flow rates of the inert gas controlled by the MFCs 512, 522, 532 and 542 may be set to flow rates within a range of 0.1 slm to 30 slm, respectively.

That is, residues in the process chamber 201 such as the second gas which did not react or which contributed to the formation of the TiN layer and the reaction by-products are removed out of the process chamber 201. The inert gas serves as the purge gas.

Performing a Predetermined Number of Times

By performing the cycle wherein the first step through the eighth step described above are sequentially performed in this order at least once, that is, a predetermined number of times (N times), the film of a predetermined thickness is formed on the wafers 200. That is, the supply of the first gas and the supply of the third gas are performed partially in parallel, then the supply of the adsorption inhibitory gas is performed, and then the supply of the second gas is performed. Thereby, the film of the predetermined thickness is formed on the wafers 200. According to the present embodiments, for example, the TiN film is formed.

After-Purge Step and Returning to Atmospheric Pressure Step

The inert gas is supplied into the process chamber 201 through each of the gas supply pipes 510, 520, 530 and 540, and is exhausted through the exhaust pipe 231. The inert gas serves as the purge gas, and the inner atmosphere of the process chamber 201 is purged with the inert gas. Thereby, the residual gas in the process chamber 201 or the reaction by-products remaining in the process chamber 201 are removed from the process chamber 201 (after-purge step). Thereafter, the inner atmosphere of the process chamber 201 is replaced with the inert gas (substitution by the inert gas), and the inner pressure of the process chamber 201 is returned to the normal pressure, i.e., atmospheric pressure (returning to atmospheric pressure step).

Boat Unloading Step and Wafer Discharging Step

Thereafter, the seal cap 219 is lowered by the boat elevator 115 and the lower end of the outer tube 203 is opened. The boat 217 with the processed wafers 200 charged therein is unloaded out of the outer tube 203 through the lower end of the outer tube 203 (boat unloading step). Then, the processed wafers 200 are transferred (discharged) from the boat 217 (wafer discharging step).

That is, when batch-processing the wafers 200 using the substrate processing apparatus 10 as described above, by supplying the adsorption inhibitory gas to a part of the process region, it is possible to improve the processing uniformity between the wafers 200 batch-processed.

Effects According to Present Embodiments

According to the present embodiments described above, it is possible to obtain at least one among the following effects.
(a) It is possible to improve the processing uniformity of the substrate processing between wafers (substrates).
(b) It is possible to improve the processing uniformity of the substrate processing on the surfaces of the wafers (substrates).
(c) It is possible to uniformize the characteristics (electrical characteristics) of the films formed on the wafers (substrates).

Figure 6:
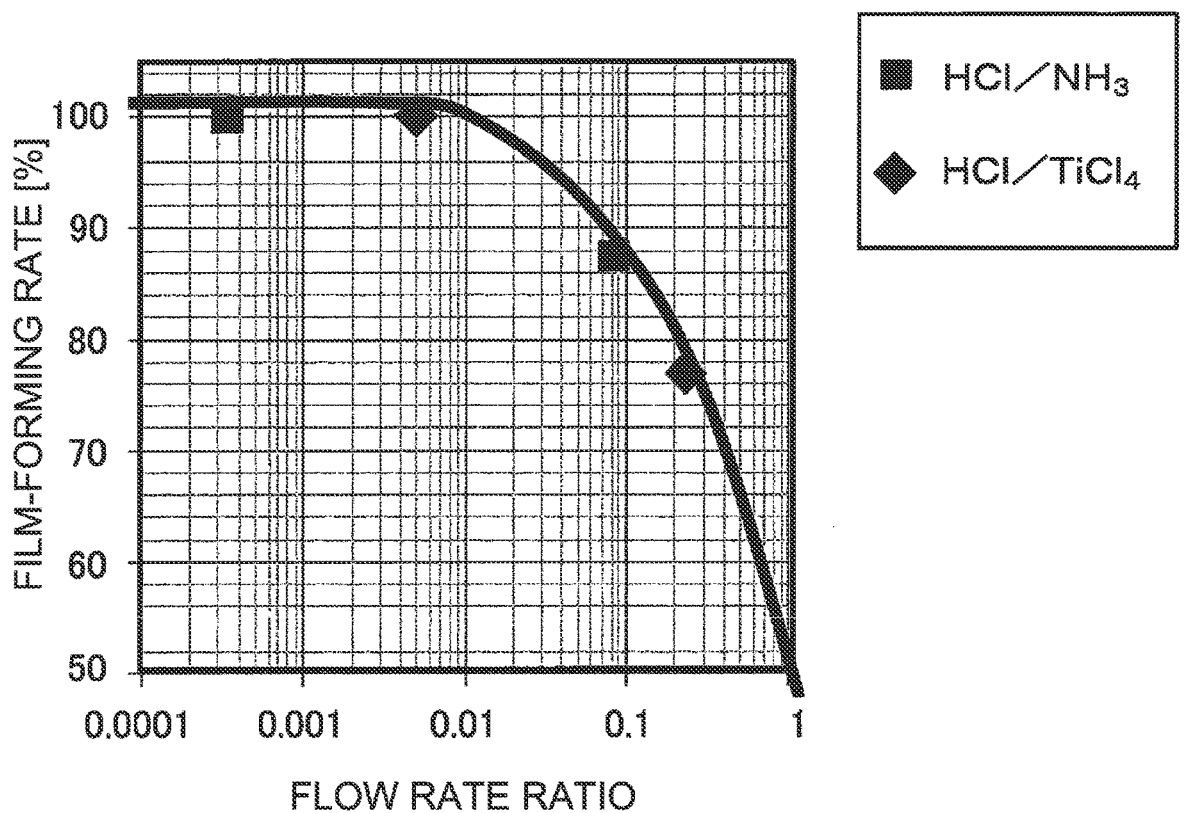
FIG. 6 is a diagram schematically illustrating a relationship among a flow rate ratio of hydrogen chloride (HCl) gas with respect to titanium tetrachloride (TiCl4) gas, a flow rate ratio of the HCl gas with respect to ammonia ($NH_3$) gas and a film-forming rate of a TiN film in a case where the HCl gas is added when the TiN film is formed on the substrate by supplying the $TiCl_4$ gas and the $NH_3$ gas to the substrate.

Hereinafter, as an example, a mechanism of obtaining the effect of (a) will be described with reference to FIG. 6. FIG. 6 is a diagram schematically illustrating a relationship among a flow rate ratio of the hydrogen chloride (HCl) gas with respect to the titanium tetrachloride ($TiCl_4$) gas, a flow rate ratio of the HCl gas with respect to the ammonia ($NH_3$) gas and the film-forming rate of the TiN film in a case where the HCl gas (which is the reaction by-products generated when a metal nitride film such as the TiN film is formed) is added to each of the $TiCl_4$ gas and the $NH_3$ gas when the TiN film serving as a metal nitride film is formed on the wafer 200 by supplying the $TiCl_4$ gas and the $NH_3$ gas to the wafer 200.

As shown in FIG. 6, it is confirmed that the film-forming rate of the TiN film is lowered by increasing the flow rate of the HCl gas with respect to each of the $TiCl_4$ gas and the $NH_3$ gas. That is, it is possible to lower the film-forming rate by supplying the HCl to a part of the process region where the HCl (which is the reaction by-products of the $TiCl_4$ gas and the $NH_3$ gas) is produced in a small amount. It is also possible to suppress the phenomenon in which the thickness of the film in the upper end portion and the lower end portion of the process region becomes thick. It is also possible to improve the thickness uniformity of the films formed on the wafers (substrates).

Other Embodiments

While the technique of the present disclosure is described in detail by way of the embodiments described above, the technique of the present disclosure is not limited thereto. The embodiments described above may be modified in various ways without departing from the scope thereof.

First Modified Example

FIG. 7A is a diagram schematically illustrating a modified example of the nozzle 440 described above. According to the present modified example, a nozzle 450 is used instead of the nozzle 440. A length of the nozzle 450 is set to be shorter than that of each of the nozzle 410 through which the first gas is supplied, the nozzle 420 through which the second gas is supplied, and the nozzle 430 through which the third gas is supplied. The nozzle 450 is provided with a plurality of gas supply holes 450a through which the adsorption inhibitory gas is supplied at positions corresponding to the lower wafers among the wafers 200 located in the lower end portion of the process region (which is a part of the process region). Also in this case, the adsorption inhibitory gas is supplied only to the lower wafers among the wafers 200 located in the lower end portion of the process region (which is the portion of the process region where the amount of the reaction by-products is small). As a result, it is possible to improve the processing uniformity between the wafers 200. Therefore, it is possible to reduce the thickness of the film formed on the lower wafers, and also to improve the thickness uniformity of the films formed on the wafers 200. It is also possible to uniformize the characteristics of the film formed on the wafers 200.

Second Modified Example

Figure 7B:
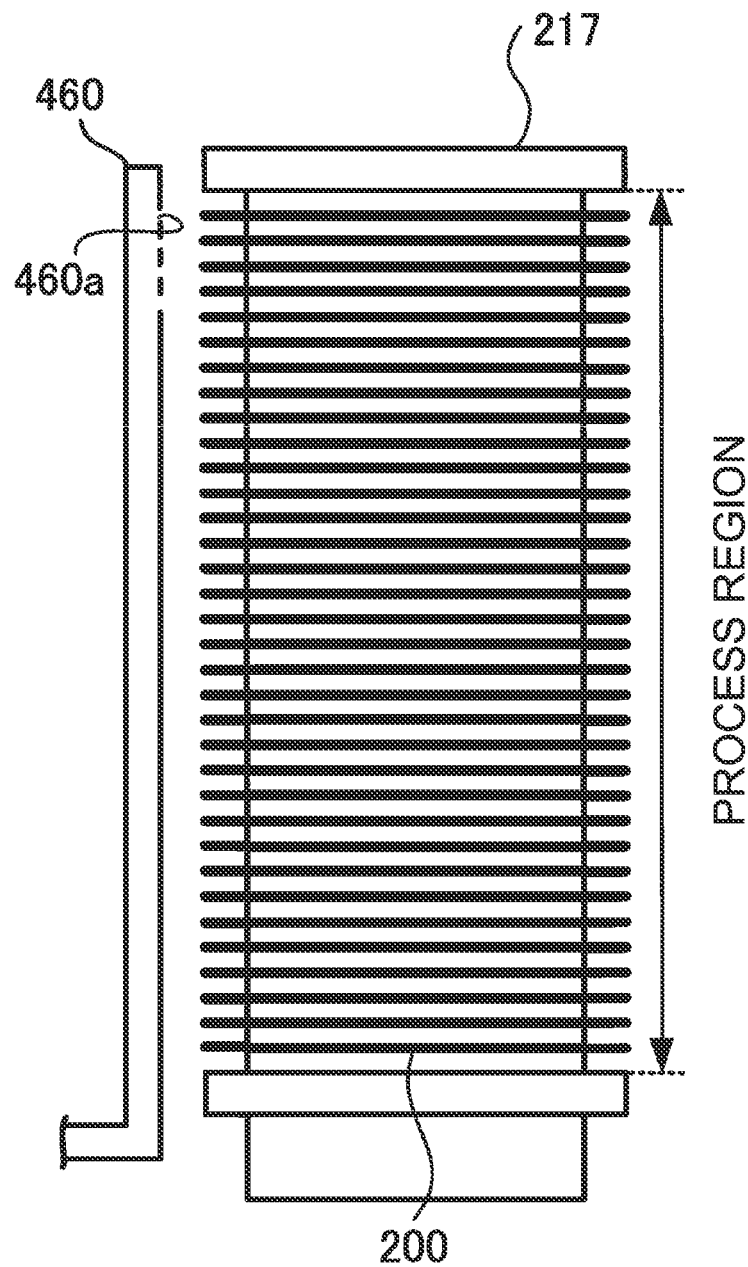

FIG. 7B is a diagram schematically illustrating another modified example of the nozzle 440 described above. According to the present modified example, a nozzle 460 is used instead of the nozzle 440. A length of the nozzle 460 is set to be substantially the same as that of each of the nozzle 410, the nozzle 420 and the nozzle 430. The nozzle 460 is provided with a plurality of gas supply holes 460a through which the adsorption inhibitory gas is supplied at positions corresponding to the upper wafers among the wafers 200 located in the upper end portion of the process region (which is a part of the process chamber). Also in this case, the adsorption inhibitory gas is supplied only to the upper wafers among the wafers 200 located in the upper end portion of the process region (which is the portion of the process region where the amount of the reaction by-products is small). As a result, it is possible to improve the processing uniformity between the wafers 200. Therefore, it is possible to reduce the thickness of the film formed on the upper wafers, and also to improve the thickness uniformity of the films formed on the wafers 200. It is also possible to uniformize the characteristics of the films formed on the wafers 200.

Third Modified Example

Figure 7C:
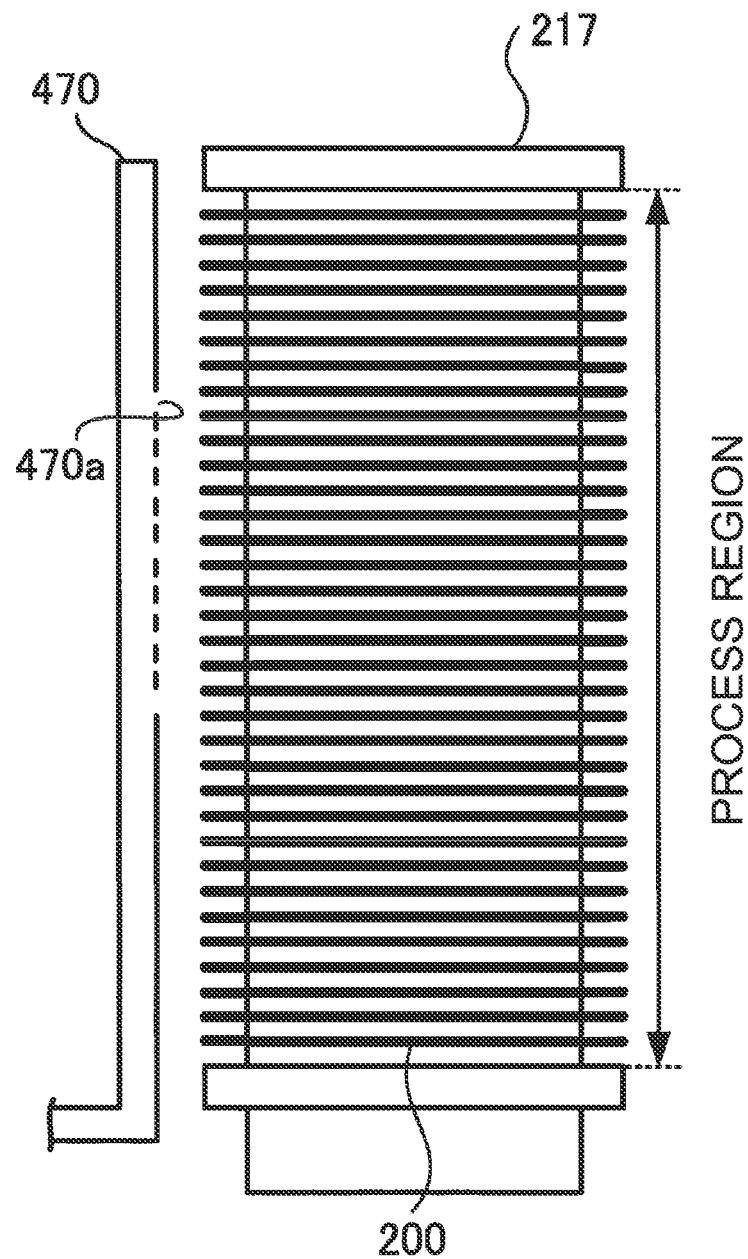

FIG. 7C is a diagram schematically illustrating still another modified example of the nozzle 440 described above. According to the present modified example, a nozzle 470 is used instead of the nozzle 440. The nozzle 470 is provided with a plurality of gas supply holes 470a through which the adsorption inhibitory gas is supplied at positions corresponding to the wafers among the wafers 200 in the central portion of the process region (which is a part of the process region). When the amount of the reaction by-products is small in the central portion of the process region and the thickness of the film formed on middle wafers among the wafers 200 arranged in the central portion of the process region is thicker than the films formed on the upper and lower wafers among the wafers 200 located in the upper end portion or the lower end portion of the process region, the adsorption inhibitory gas is supplied to the middle wafers among wafers 200 located in the central portion of the process region (which is a portion of the process region where the amount of the reaction by-products is small), wherein the thickness of the film formed on the middle wafers is thicker than the films formed on the upper and lower wafers. As a result, it is possible to improve the processing uniformity between the wafers 200. Therefore, it is possible to reduce the thickness of the film formed on the middle wafers, and also to improve the thickness uniformity of the films formed on the wafers 200. It is also possible to uniformize the characteristics of the films formed on the wafers 200.

Fourth Modified Example

Figure 8A:
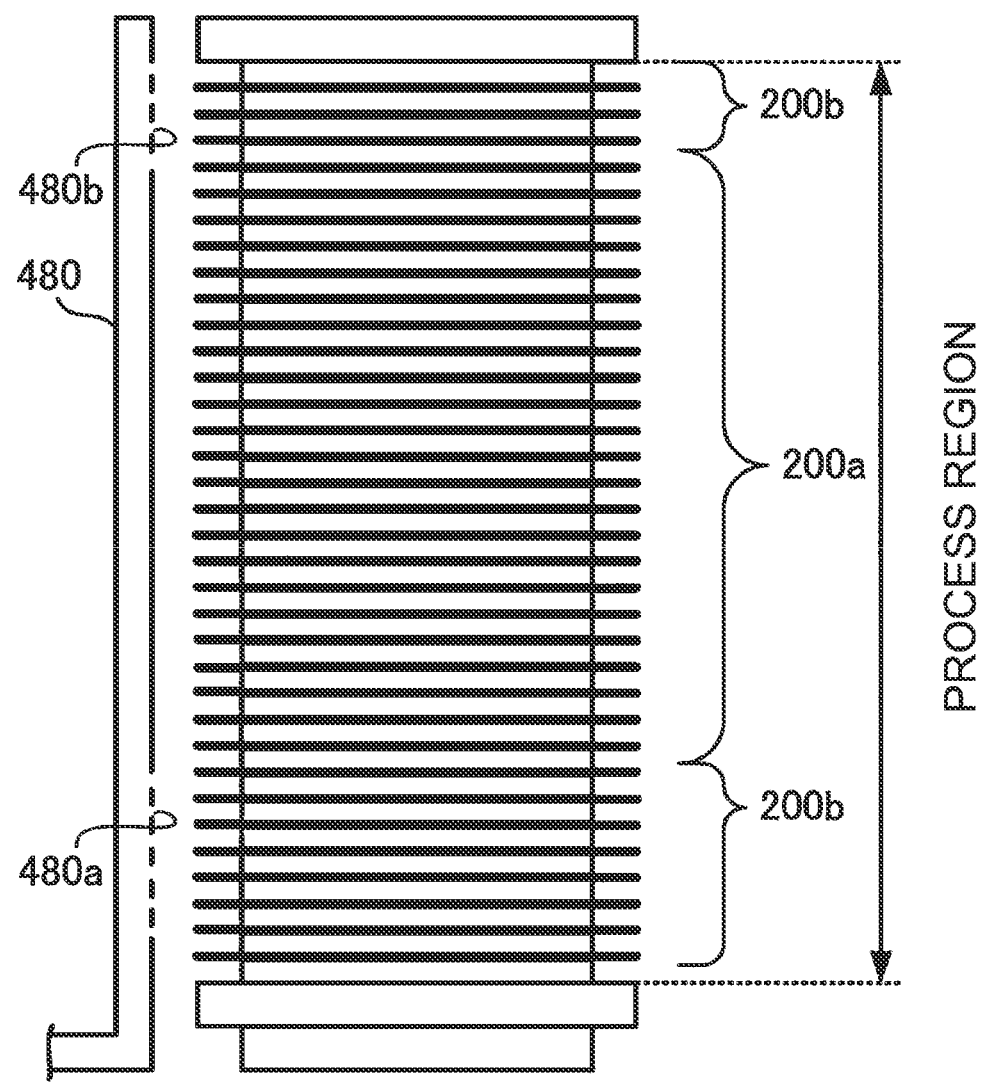
FIGS. 8A and 8B are diagrams schematically illustrating another modified examples of the third nozzle according to the embodiments of the present disclosure.

FIG. 8A is a diagram schematically illustrating still another modified example of the nozzle 440 described above. According to the present modified example, a nozzle 480 is used instead of the nozzle 440. In the boat 217, a plurality of dummy wafers 200b are provided on each of the upper end portion and the lower end portion of the process region. In the boat 217, a plurality of wafers 200a which are "large surface area wafers" are provided in the process region between lower dummy wafers among the dummy wafers 200b in the lower end portion and upper dummy wafers among the dummy wafers 200b in the upper end portion of the process region. The nozzle 480 is provided with a plurality of gas supply holes 480a through which the adsorption inhibitory gas is supplied that are located in the lower region of the process region at positions corresponding to the lower dummy wafers among the dummy wafers 200b located in the lower end portion of the process region, and a plurality of gas supply holes 480b through which the adsorption inhibitory gas is supplied that are located in the upper region of the process region at positions corresponding to the upper dummy wafers among the dummy wafers 200b located in the upper end portion of the process region. By providing the plurality of gas supply holes 480a and the plurality of gas supply holes 480b in the upper end portion and the lower end portion of the process region (which is portions of the process region), respectively, at positions corresponding to the lower and upper dummy wafers among the dummy wafers 200b located in the lower end portion and the upper end portion of the process region where the amount of the reaction by-products is small, the adsorption inhibitory gas is supplied to the lower and upper dummy wafers. As a result, it is possible to improve the processing uniformity between the wafers 200a. Therefore, it is possible to reduce the thickness of the films formed on such wafers among the wafers 200a that are located in the vicinity of the dummy wafers 200b in the process region, and also to improve the thickness uniformity of the films formed on the wafers 200a. It is also possible to uniformize the characteristics of the films formed on the wafers 200a.

Fifth Modified Example

Figure 8B:
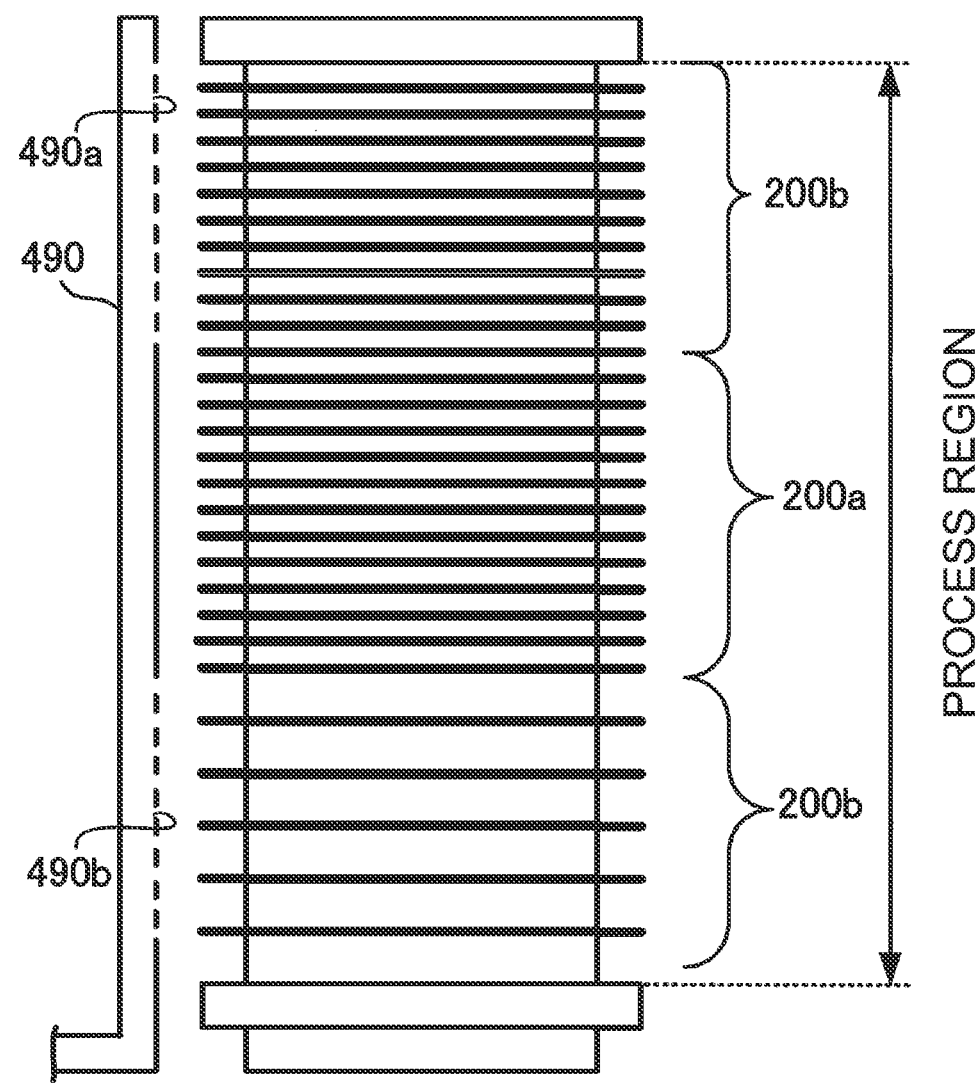

FIG. 8B is a diagram schematically illustrating still another modified example of the nozzle 440 described above. According to the present modified example, a nozzle 490 is used instead of the nozzle 440. In the process region of the boat 271, a region in which some of the dummy wafers 200b are densely arranged (or a relatively large number of dummy wafers among the dummy wafers 200b are arranged) and a region in which some of the dummy wafers 200b are sparsely arranged (or a relatively small number of dummy wafers among the dummy wafers 200b are arranged) are provided. The nozzle 490 is provided with a plurality of gas supply holes 490a through which the adsorption inhibitory gas is supplied at positions corresponding to the region in which some of the dummy wafers 200b are densely arranged, and a plurality of gas supply holes 490b through which the adsorption inhibitory gas is supplied at positions corresponding to the region in which some of the dummy wafers 200b are sparsely arranged.

That is, the gas supply holes 490a are provided at the nozzle 490 at positions corresponding to the region in which some of the dummy wafers 200b are densely arranged, and the gas supply holes 490b are provided at the nozzle 490 at positions corresponding to the region in which some of the dummy wafers 200b are sparsely arranged. In addition, an opening ratio of the gas supply holes 490a is set to be greater than an opening ratio of the gas supply holes 490b. As described above, the gas supply holes 490a and the gas supply holes 490b whose opening ratios are different from each other are arranged in accordance with a density of the dummy wafers 200b in a portion of the process region where the amount of the reaction by-products is small. As a result, a large amount of the adsorption inhibitory gas is supplied to the portion of the process region where the amount of the reaction by-products is small. As a result, it is possible to improve the processing uniformity of the wafers 200a. Therefore, it is possible to reduce the thickness of the film formed on such wafers among the wafers 200a that are located in the vicinity of the dummy wafers 200b in the process region, and also possible to improve the thickness uniformity of the films formed on the wafers 200a. It is also possible to uniformize the characteristics of the films formed on the wafers 200a. In addition, the density of the dummy wafers 200b may be adjusted in accordance with arrangement positions of the gas supply holes 490a and 490b whose opening ratios are different from each other.

For example, the dummy wafer 200b may include a wafer such as a non-product wafer or a bare wafer, and the positions where the dummy wafers 200b are provided are not limited to those shown in the fourth modified example or the fifth modified example. That is, a plurality of gas supply holes, through which the adsorption inhibitory gas is supplied, are provided at a nozzle in a manner corresponding to the positions where the dummy wafers 200b are provided. For example, when the dummy wafers 200b are collectively arranged in the lower region of the process region, the plurality of gas supply holes through which the adsorption inhibitory gas is supplied are provided at the nozzle in a manner corresponding to the dummy wafers 200b collectively arranged in the lower region of the process region. In addition, when the dummy wafers 200b are dispersedly arranged in the process region, the plurality of gas supply holes through which the adsorption inhibitory gas is supplied are provided at the nozzle in a manner corresponding to the dummy wafers 200b dispersedly arranged in the process region. By providing the plurality of gas supply holes through which the adsorption inhibitory gas is supplied at the nozzle in a manner corresponding to the dummy wafers 200b in the portion of the process region where the amount of the reaction by-products is small, the adsorption inhibitory gas is supplied to a group of the dummy wafers 200b that are located in the portion of the process region where the amount of the reaction by-products is small. As a result, it is possible to improve the processing uniformity of the wafers 200a serving as the large surface area wafers. Therefore, it is possible to reduce the thickness of the film formed on such wafers among the wafers 200a that are located in the vicinity of the dummy wafers 200b in the process region, and also to improve the thickness uniformity of the films formed on the wafers 200a. It is also possible to uniformize the characteristics of the films formed on the wafers 200a.

For example, the present modified example is not limited to a case where the dummy wafers 200b are used. For example, the plurality of gas supply holes through which the adsorption inhibitory gas is supplied may be provided at positions of the nozzle corresponding to positions in the process region where a density of the wafers 200 serving as product wafers is high. Further, the plurality of gas supply holes through which the adsorption inhibitory gas is supplied may be arranged in accordance with the density of the wafers 200 serving as the product wafers. In addition, the wafers 200 may be densely provided at positions corresponding to the positions where the plurality of gas supply holes through which the adsorption inhibitory gas is supplied are arranged. By providing the plurality of gas supply holes through which the adsorption inhibitory gas is supplied the positions of the nozzle corresponding to the wafers 200 in the portion of the process region where the amount of the reaction by-products is small, the adsorption inhibitory gas is supplied to the wafers 200 in the portion of the process region where the amount of the reaction by-products is small. As a result, it is possible to improve the processing uniformity between the wafers 200.

Sixth Modified Example

Figure 5:
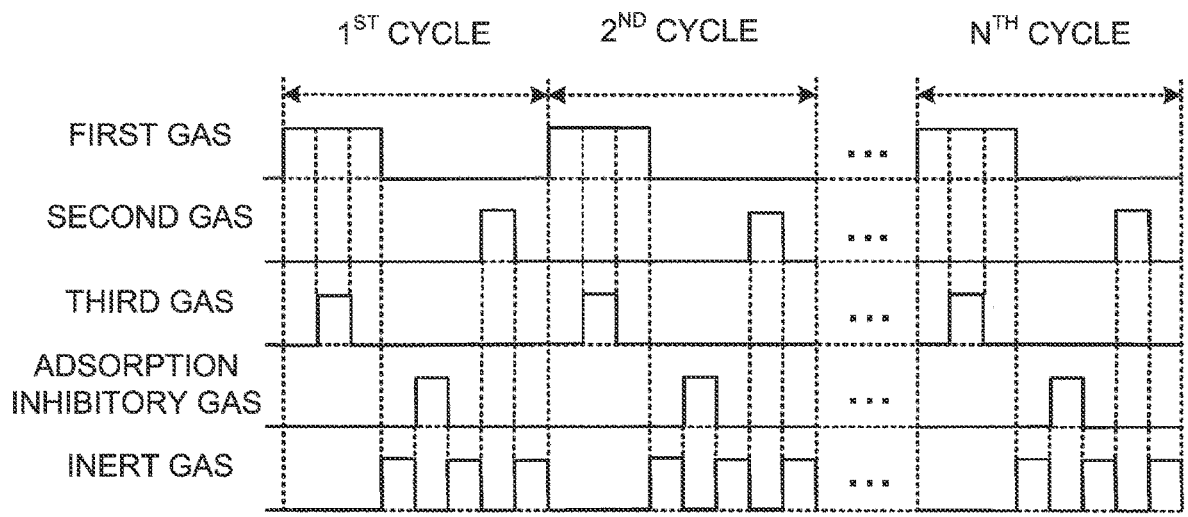
FIG. 5 is a diagram schematically illustrating a substrate processing sequence according to the embodiments of the present disclosure.
Figure 9:
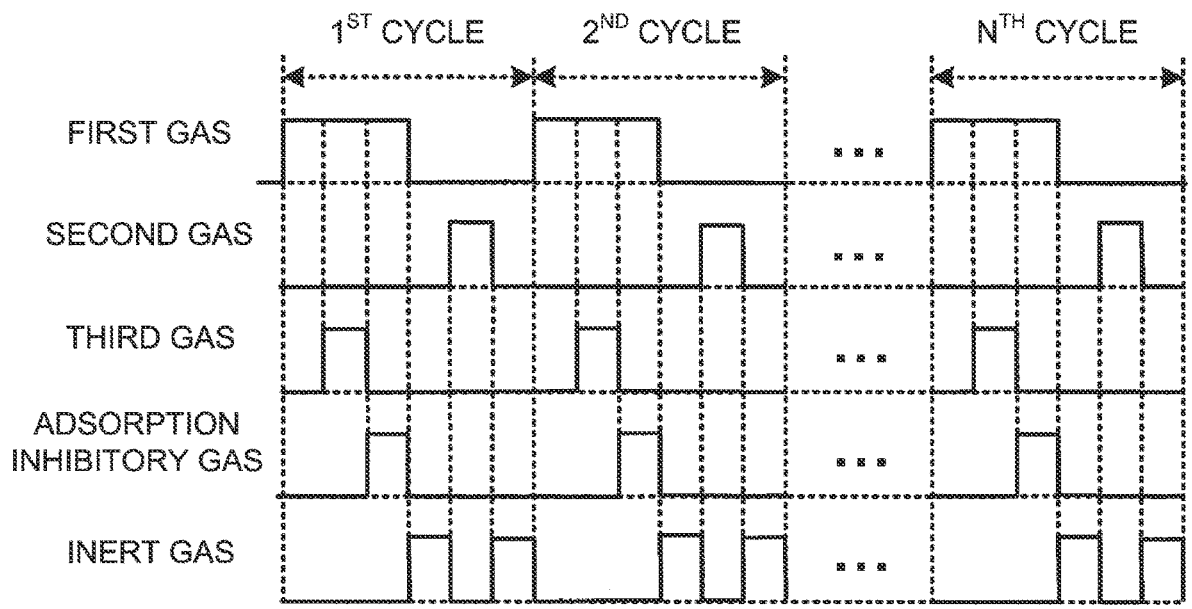
FIG. 9 is a diagram schematically illustrating a modified example of the substrate processing sequence according to the embodiments of the present disclosure.

FIG. 9 is a diagram schematically illustrating a modified example of the substrate processing sequence shown in FIG. 5. According to the present modified example, the adsorption inhibitory gas is supplied when the first gas is supplied in the third step described above. That is, according to the present modified example, a cycle according to the sixth modified example is performed at least once, that is, a predetermined number of times (N times). In the cycle according to the sixth modified example, after performing the first step and the second step described above, the third step of supplying the first gas and the fifth step of supplying the adsorption inhibitory gas are simultaneously performed, and then the fourth step, the seventh step and the eighth step described above are sequentially performed in this order. That is, in the cycle according to the sixth modified example, the supply of the first gas and the supply of the third gas are performed partially in parallel, then the supply of the first gas and the supply of the adsorption inhibitory gas are performed in parallel, and then the supply of the second gas is performed. That is, for example, by supplying the HCl gas serving as the adsorption inhibitory gas in parallel with the $TiCl_4$ gas serving as the first gas at a final stage of the supply of the $TiCl_4$ gas, the HCl gas serving as the adsorption inhibitory gas is supplied to the upper and lower wafers among the wafers 200 located in the upper end portion and the lower end portion of the process region while the $TiCl_4$ gas is being supplied. Thereby, the HCl is adsorbed on the upper and lower wafers. As a result, the $NH_3$ gas serving as the second gas does not react with the $TiCl_4$ gas, and the adsorption of the $TiCl_4$ by supplying the $TiCl_4$ gas serving as the first gas is also inhibited in a next performance of the cycle according to the sixth modified example. Therefore, the TiN layer is not formed on the upper and lower wafers. Therefore, it is possible to lower the film-forming rate of the upper and lower wafers among the wafers 200 located in the upper end portion and the lower end portion of the process region to which the adsorption inhibitory gas is supplied. In addition, the $NH_3$ gas reacts with the HCl gas serving as the adsorption inhibitory gas to generate the $NH_4Cl$. However, the $NH_4Cl$ does not remain in the film because it is desorbed from the wafers 200 without being adsorbed thereon. Therefore, the electrical characteristics of the film are less affected. In addition, by supplying the HCl gas in parallel with the $TiCl_4$ gas serving as the first gas at the final stage of the supply of the $TiCl_4$ gas, it is possible to suppress the HCl from being introduced into the titanium-containing layer. Therefore, it is possible to obtain the same effects as the substrate processing sequence shown in FIG. 5 described above.

Seventh Modified Example

Figure 10:
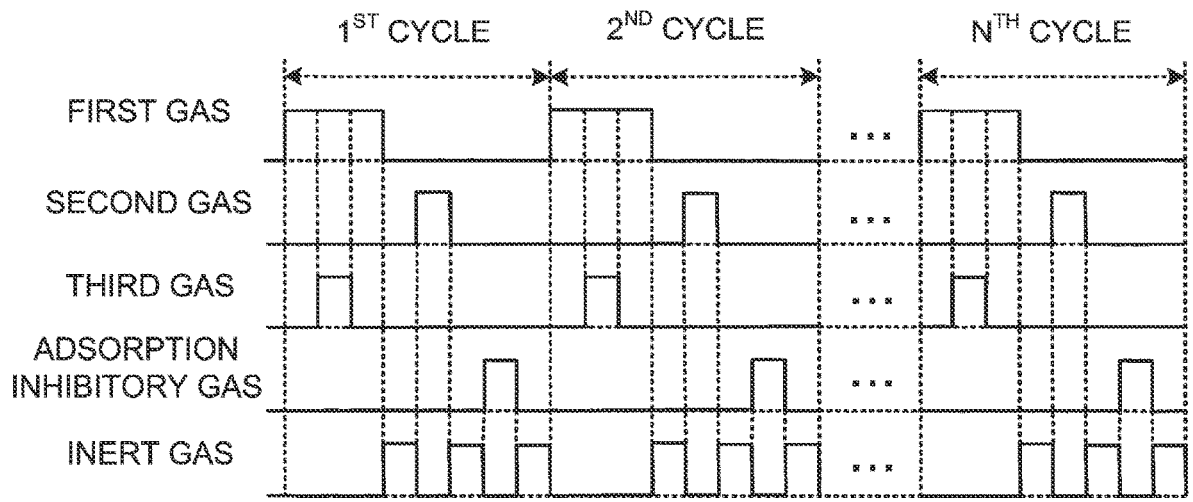
FIG. 10 is a diagram schematically illustrating another modified example of the substrate processing sequence according to the embodiments of the present disclosure.

FIG. 10 is a diagram schematically illustrating another modified example of the substrate processing sequence shown in FIG. 5. According to the present modified example, the adsorption inhibitory gas is supplied after the second gas is supplied in the seventh step described above. That is, according to the present modified example, a cycle according to the seventh modified example is performed at least once, that is, a predetermined number of times (N times). In the cycle according to the seventh modified example, after performing the first step through the fourth step described above, the seventh step of supplying the second gas and the eighth step are performed, and then the fifth step of supplying the adsorption inhibitory gas and the sixth step described above are sequentially performed in this order. That is, in the cycle according to the seventh modified example, the supply of the first gas and the supply of the third gas are performed partially in parallel, then the supply of the second gas is performed, and then the supply of the adsorption inhibitory gas is performed. That is, for example, after supplying the $NH_3$ gas serving as the second gas, the HCl gas serving as the adsorption inhibitory gas is supplied to the upper and lower wafers among the wafers 200 located in the upper end portion and the lower end portion of the process region. Thereby, the HCl is adsorbed on the upper and lower wafers. As a result, the adsorption of the $TiCl_4$ by supplying the $TiCl_4$ gas serving as the first gas is inhibited in a next performance of the cycle according to the seventh modified example. Thereby, the $NH_3$ gas serving as the second gas in the next performance of the cycle according to the seventh modified example does not react with the $TiCl_4$, and the TiN layer is not formed on the upper and lower wafers. Therefore, it is possible to lower the film-forming rate of the upper and lower wafers among the wafers 200 located in the upper end portion and the lower end portion of the process region to which the adsorption inhibitory gas is supplied. In addition, a part of the HCl reacts with the $SiH_4$ gas serving as the third gas, and for example, is desorbed from the wafers 200 before the $NH_3$ gas is supplied. However, most of the HCl reacts with $NH_3$ when the $NH_3$ gas is supplied to generate the $NH_4Cl$, and the $NH_4Cl$ does not remain in the film because it is desorbed from the wafers 200 without being adsorbed thereon. Therefore, the electrical characteristics of the film are less affected. Therefore, it is possible to obtain the same effects as the substrate processing sequence shown in FIG. 5 described above.

Eighth Modified Example

Figure 11:
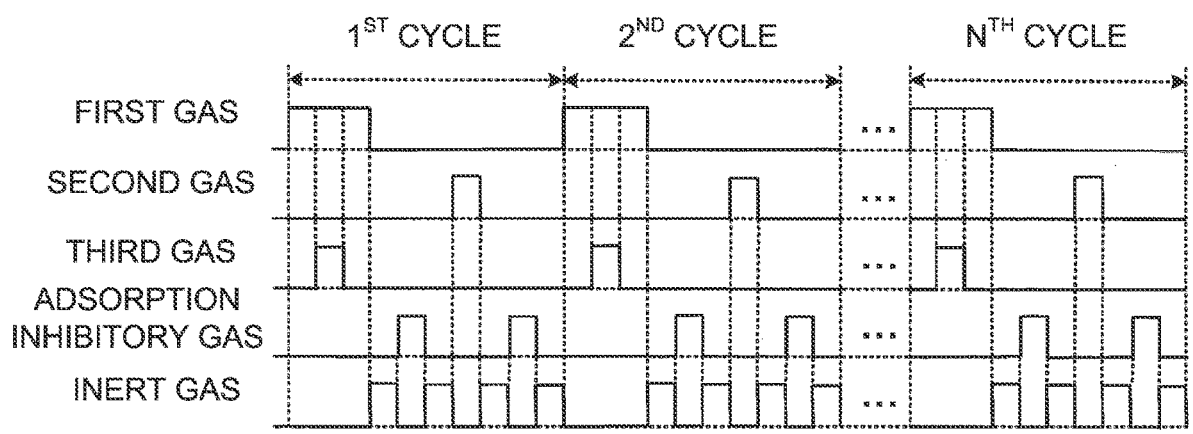
FIG. 11 is a diagram schematically illustrating still another modified example of the substrate processing sequence according to the embodiments of the present disclosure.

FIG. 11 is a diagram schematically illustrating still another modified example of the substrate processing sequence shown in FIG. 5. According to the present modified example, in addition to the fifth step described above, the adsorption inhibitory gas is also supplied after the second gas is supplied. That is, according to the present modified example, a cycle according to the eighth modified example is performed at least once, that is, a predetermined number of times (N times). In the cycle according to the eighth modified example, after performing the first step through the eighth step described above, a ninth step of supplying the adsorption inhibitory gas and a tenth step of supplying the purge gas are sequentially performed in this order. That is, in the cycle according to the eighth modified example, the supply of the first gas and the supply of the third gas are performed partially in parallel, then the supply of the adsorption inhibitory gas is performed, then the supply of the second gas is performed, and then the supply of the adsorption inhibitory gas is further performed. That is, for example, after supplying the $TiCl_4$ gas serving as the first gas, the HCl gas serving as the adsorption inhibitory gas is supplied to the upper and lower wafers among the wafers 200 that are located in the upper end portion and the lower end portion of the process region. After supplying the $NH_3$ gas serving as the second gas, the HCl gas serving as the adsorption inhibitory gas is further supplied to the upper and lower wafers. Thereby, the HCl is adsorbed on the upper and lower wafers after both the $TiCl_4$ gas and the $NH_3$ gas is supplied. That is, since the HCl is adsorbed on the upper and lower wafers, the $NH_3$ does not react with the $TiCl_4$, and the adsorption of the $TiCl_4$ by supplying the $TiCl_4$ gas is also inhibited. Therefore, the TiN layer is not formed on the upper and lower wafers. In addition, by supplying the HCl gas serving as the adsorption inhibitory gas after the $NH_3$ gas is supplied, the HCl reacts with $NH_3$ to generate the $NH_4Cl$, and the $NH_4Cl$ does not remain in the film because it is desorbed from the wafers 200 without being adsorbed thereon. Therefore, the HCl and the $NH_4Cl$ does not remain in the film. Thereby, it is possible to lower the film-forming rate of the upper and lower wafers among the wafers 200 that are located in the upper end portion and the lower end portion of the process region to which the adsorption inhibitory gas is supplied. In addition, the electrical characteristics of the film are less affected. Therefore, it is possible to obtain the same effects as the substrate processing sequence shown in FIG. 5 described above.

For example, the embodiments and the modified examples are described in detail by way of an example in which a purge is performed among the supply of the first gas, the supply of the second gas and the supply of the adsorption inhibitory gas. However, the technique of the present disclosures is not limited thereto. For example, the purge may not be performed among the supply of the first gas, the supply of the second gas and the supply of the adsorption inhibitory gas.

For example, the embodiments and the modified examples are described in detail by way of an example in which the TiN film is formed on the wafer 200. However, the technique of the present disclosures is not limited thereto. For example, the technique of the present disclosures may also be preferably applied when a film containing at least one element among titanium (Ti), aluminum (Al), hafnium (Hf), zirconium (Zr), molybdenum (Mo), tungsten (W), ruthenium (Ru) and silicon (Si) is formed.

For example, the embodiments and the modified examples are described in detail by way of an example in which the $TiCl_4$ gas serving as the gas containing a metal element and a halogen element is used as the first gas. However, the technique of the present disclosures is not limited thereto. For example, the technique of the present disclosures may also be preferably applied when a gas such as aluminum chloride ($AlCl_3$) gas, hafnium chloride ($HfCl_4$) gas, zirconium chloride ($ZrCl_4$) gas, molybdenum pentachloride ($MoCl_5$) gas, molybdenum dichloride dioxide ($MoO_2Cl_2$) gas, molybdenum oxytetrachloride ($MoOCl_4$) gas, tungsten hexafluoride ($WF_6$) gas, tungsten hexachloride ($WCl_6$) gas and a gas containing ruthenium and a halogen element is used as the first gas. In addition, for example, the technique of the present disclosures may also be preferably applied when a gas containing a group 14 element such as silicon (Si) and germanium (Ge) and a halogen element such as hexachlorodisilane ($Si_2Cl_6$, abbreviated as HCDS) gas and germanium chloride ($Ge_2Cl_6$) gas is used as the first gas.

For example, the embodiments and the modified examples are described in detail by way of an example in which the $NH_3$ gas serving as the gas containing nitrogen and hydrogen (which is a reducing gas and the reactive gas) is used as the second gas. However, the technique of the present disclosures is not limited thereto. For example, the technique of the present disclosures may also be preferably applied when a gas containing at least one among a mixed gas of nitrogen ($N_2$) gas and hydrogen ($H_2$) gas, diazene ($N_2H_2$) gas, triazene ($N_3H_3$) gas, hydrazine ($N_2H_4$) gas and other gases containing an amine group is used as the second gas. In addition, when the HCl gas is used as the adsorption inhibitory gas, the $NH_3Cl$ is generated by the reaction between the HCl gas and the $NH_3$ gas. Therefore, it is preferable to use the $NH_3$ gas as the second gas.

For example, the embodiments and the modified examples are described in detail by way of an example in which the gas containing nitrogen and hydrogen is used as the second gas. However, the technique of the present disclosures is not limited thereto. For example, a reducing gas free of nitrogen may be used as the second gas. For example, the technique of the present disclosures may also be preferably applied when a gas containing at least one among hydrogen ($H_2$) gas, deuterium (D) gas, disilane ($Si_2H_6$) gas, trisilane ($Si_3H_8$) gas, monogermane (germanium tetrahydride) ($GeH_4$) gas, digermane ($Ge_2H_6$) gas, trigermane ($Ge_3H_6$) gas, monoborane ($BH_3$) gas, diborane ($B_2H_6$) gas and phosphine ($PH_3$) is used as the second gas. By using the reducing gas free of nitrogen, it is possible to form a film other than a nitride film.

For example, the embodiments and the modified examples are described in detail by way of an example in which the $SiH_4$ gas serving as the hydrogen-containing gas (which is a reducing gas) is used as the third gas. However, the technique of the present disclosures is not limited thereto. For example, the technique of the present disclosures may also be preferably applied when a gas containing at least one among the hydrogen ($H_2$) gas, the disilane ($Si_2H_6$) gas, the trisilane ($Si_3H_8$) gas, the monoborane ($BH_3$) gas, the diborane ($B_2H_6$) gas and phosphine ($PH_3$) is used as the third gas.

For example, the embodiments and the modified examples are described in detail by way of an example in which the film is formed on the wafer 200 using the first gas, the second gas, the third gas and the adsorption inhibitory gas. However, the technique of the present disclosures is not limited thereto. For example, the technique of the present disclosures may also be preferably applied when the film is formed on the wafer 200 using the first gas, the second gas and the adsorption inhibitory gas. That is, the film may be formed without using the third gas. Even when the film is formed without using the third gas, it is possible to obtain some of the effects described above.

For example, the embodiments and the modified examples are described in detail by way of an example in which the HCl gas serving as a gas containing a halogen element is used as the adsorption inhibitory gas. However, the technique of the present disclosures is not limited thereto. For example, the technique of the present disclosures may also be preferably applied when a gas containing a halogen element of the same type as the halogen element contained in the first gas is used as the adsorption inhibitory gas. For example, a gas such as the ammonium chloride ($NH_4Cl$) gas, chlorine ($Cl_2$) gas, hydrogen fluoride (HF) gas and fluorine ($F_2$) gas may also be used as the adsorption inhibitory gas. In addition, it is preferable that a gas containing the same composition as the reaction by-products generated by the reaction between the first gas and the second gas is used as the adsorption inhibitory gas.

For example, the embodiments and the modified examples are described in detail by way of an example in which the film containing a metal element and nitrogen is formed on the wafer 200. However, the technique of the present disclosures is not limited thereto. For example, the technique of the present disclosures may also be preferably applied when another film such as a metal film, a film containing a group 14 element as a main component, an oxide film, an oxynitride film and a carbide film is formed on the wafer 200 by appropriately selecting each gas.

For example, the embodiments and the modified examples are described in detail by way of an example in which a batch type vertical substrate processing apparatus capable of simultaneously processing a plurality of substrates is used to perform the substrate processing (film-forming process). However, the technique of the present disclosures is not limited thereto. For example, the technique of the present disclosures may also be preferably applied when a single wafer type substrate processing apparatus capable of processing one or several substrates at a time is used to perform the substrate processing (film-forming process). In such a case, a process region of the single wafer type substrate processing apparatus may be a region between the substrate (or the several substrates) and a gas supplier (which is a gas supply structure or a gas supply system) such as a shower head of the single wafer type substrate processing apparatus. By supplying the adsorption inhibitory gas to a portion of the process region, it is possible to improve a uniformity of the film on the surface of the substrate.

When the single wafer type substrate processing apparatus described above is used, substrate processing sequences and process conditions may be substantially the same as those of the embodiments described above.

It is preferable that the process recipe (that is, a program defining parameters such as the substrate processing sequences and the process conditions) used to form the various films described above is prepared individually according to the contents of the substrate processing such as a type of the film to be formed, a composition ratio of the film, a quality of the film, a thickness of the film, the substrate processing sequence and the process conditions of the substrate processing. That is, a plurality of process recipes are prepared in advance. When starting the substrate processing, an appropriate process recipe is preferably selected among the plurality of the process recipes according to the contents of the substrate processing. Specifically, it is preferable that the plurality of the process recipes are stored (installed) in the memory 121c of the substrate processing apparatus 10 in advance via an electric communication line or the recording medium (for example, the external memory 123) storing the plurality of the process recipes. Then, when starting the substrate processing, the CPU 121a preferably selects the appropriate process recipe among the plurality of the process recipes stored in the memory 121c of the substrate processing apparatus 10 according to the contents of the substrate processing. Thereby, various films of different types, composition ratios, different qualities and different thicknesses may be formed for general use at the high reproducibility using a single substrate processing apparatus. In addition, since a burden on an operator such as inputting the substrate processing sequence and the process conditions may be reduced, various processes of the substrate processing can be performed quickly while avoiding an operation mistake.

The technique of the present disclosure may be implemented by changing an existing process recipe stored in the substrate processing apparatus to a new process recipe. When changing the existing process recipe to the new process recipe, the new process recipe (may be installed in the substrate processing apparatus via the electric communication line or the recording medium storing the process recipes. The existing process recipe already stored in the substrate processing apparatus may also be directly changed to the new process recipe according to the technique of the present disclosure by operating the input/output device of the substrate processing apparatus.

In addition, the technique of the present disclosure may also be preferably applied to a word line of a DRAM or a NAND flash memory of a three-dimensional structure.

While the technique of the present disclosure is described in detail by way of the embodiments and the modified examples, the technique of the present disclosure is not limited thereto. For example, the embodiments and the modified examples described above may be appropriately combined.

According to some embodiments of the present disclosure, it is possible to improve the processing uniformity between the substrates.

What is claimed is:

1. A substrate processing apparatus comprising:
a process vessel provided with a process region in which a plurality of substrates is arranged and processed;
a first nozzle provided with a plurality of first gas supply holes, through which a first gas is supplied to the plurality of substrates, arranged over an entirety of the process region;
a second nozzle provided with a plurality of second gas supply holes, through which a second gas reacting with the first gas is supplied to the plurality of substrates, arranged over the entirety of the process region;
a third nozzle provided with one or more third gas supply holes, through which an adsorption inhibitory gas inhibiting an adsorption of the first gas is supplied to the plurality of substrates;
a gas supply system capable of supplying the first gas, the second gas and the adsorption inhibitory gas to the plurality of substrates through the first nozzle, the second nozzle and the third nozzle, respectively; and
a controller configured to be capable of controlling the gas supply system so as to perform a process comprising:
(a) supplying the first gas to the plurality of substrates;
(b) supplying the second gas to the plurality of substrates; and
(c) supplying the adsorption inhibitory gas to the plurality of substrates, via the one or more third gas supply holes at a part of the process region where an amount of reaction by-products generated by a reaction between the first gas and the second gas during the process is smaller than an amount of the reaction by products in the other part of the process region during the process along a direction of the plurality of substrates being arranged, wherein the adsorption inhibitory gas includes a halogen element.

2. The substrate processing apparatus of claim 1, wherein the one or more third gas supply holes are provided at the third nozzle at one or more positions corresponding to one or more lower substrates among the plurality of substrates located in a lower end portion of the process region.

3. The substrate processing apparatus of claim 2, wherein a plurality of fourth gas supply holes are is further provided at the third nozzle at positions corresponding to upper substrates among the plurality of substrates located in an upper end portion of the process region.

4. The substrate processing apparatus of claim 3, wherein an opening ratio of the one or more third gas supply holes is greater than an opening ratio of the plurality of fourth gas supply holes, wherein the opening ratio of the one or more third gas supply holes is defined by a size of each of the one or more third gas supply holes multiplied by the number of the one or more third gas supply holes, and the opening ratio of the plurality of fourth gas supply holes is defined by a size of each of the fourth gas supply holes multiplied by the number of the fourth gas supply holes.

5. The substrate processing apparatus of claim 1, wherein a length of the third nozzle is shorter than that of the first nozzle and that of the second nozzle.

6. The substrate processing apparatus of claim 1, wherein the one or more third gas supply holes are provided at the third nozzle at one or more positions corresponding to one or more upper substrates among the plurality of substrates located in an upper end portion of the process region.

7. The substrate processing apparatus of claim 1, wherein the one or more third gas supply holes are provided at the third nozzle at one or more positions corresponding to one or more central substrates among the one or more substrates located in a central portion of the process region.

8. The substrate processing apparatus of claim 1, wherein the one or more third gas supply holes are located at the third nozzle at one or more positions corresponding to one or more positions in the process region where a plurality of dummy substrates is are located.

9. The substrate processing apparatus of claim 8, wherein the process region comprises a first region and a second region where the plurality of dummy substrates is arranged more densely or distributed more in the first region than in the second region,
    the one or more third gas supply holes are located at the third nozzle at one or more positions corresponding to the first region, and
    a plurality of fourth gas supply holes is further located at the third nozzle at positions corresponding to the second region.

10. The substrate processing apparatus of claim 9, wherein an opening ratio of the one or more third gas supply holes is greater than an opening ratio of the plurality of fourth gas supply holes, wherein the opening ratio of the one or more third gas supply holes is defined by a size of each of the one or more third gas supply holes multiplied by the number of the one or more third gas supply holes, and the opening ratio of the plurality of fourth gas supply holes is defined by a size of each of the fourth gas supply holes multiplied by the number of the fourth gas supply holes.

11. The substrate processing apparatus of claim 1, wherein the one or more third gas supply holes are located at the third nozzle at one or more positions corresponding to positions in the process region where a density of the one or more substrates is high.

12. The substrate processing apparatus of claim 1, further comprising
    a fourth nozzle through which a third gas is supplied to the plurality of substrates,
    wherein the gas supply system is further capable of supplying the third gas to the plurality of substrates through the fourth nozzle, and
    wherein the controller is configured to be capable of controlling the gas supply system so as to perform the process further comprising:
        (d) supplying the third gas to the plurality of substrates; and
        (e) performing (a) and (d) partially in parallel, then performing (c) and then performing (b).

13. The substrate processing apparatus of claim 12, wherein the controller is further configured to be capable of controlling the gas supply system so as to perform the process further comprising:
    (f) performing (c) after (e).

14. The substrate processing apparatus of claim 1, further comprising:
    a fourth nozzle through which a third gas is supplied to the plurality of substrates,
    wherein the gas supply system is further capable of supplying the third gas to the plurality of substrates through the fourth nozzle, and
    wherein the controller is further configured to be capable of controlling the gas supply system so as to perform the process further comprising:
        (d) supplying the third gas to the plurality of substrates; and
        (e) performing (a) and (d) partially in parallel, then performing (a) and (c) in parallel, and then performing (b).

15. The substrate processing apparatus of claim 1, further comprising:
    a fourth nozzle through which a third gas is supplied to the plurality of substrates,
    wherein the gas supply system is further capable of supplying the third gas to the plurality of substrates through the fourth nozzle, and
    wherein the controller is further configured to be capable of controlling the gas supply system so as to perform the process further comprising:
        (d) supplying the third gas to the plurality of substrates; and
        (e) performing (a) and (d) partially in parallel, then performing (b), and then performing (c).

16. The substrate processing apparatus of claim 1, wherein the first gas comprises a gas containing a halogen element, the second gas comprises a reducing gas, and the adsorption inhibitory gas comprises a gas containing the halogen element.

* * * * *